(12) United States Patent
Ishii

(10) Patent No.: US 9,923,544 B2
(45) Date of Patent: Mar. 20, 2018

(54) PIEZOELECTRIC VIBRATION ELEMENT, MANUFACTURING METHOD FOR PIEZOELECTRIC VIBRATION ELEMENT, PIEZOELECTRIC RESONATOR, ELECTRONIC DEVICE, AND ELECTRONIC APPARATUS

(71) Applicant: Seiko Epson Corporation, Tokyo (JP)

(72) Inventor: Osamu Ishii, Tatsuno (JP)

(73) Assignee: Seiko Epson Corporation (JP)

( * ) Notice: Subject to any disclaimer, the term of this patent is extended or adjusted under 35 U.S.C. 154(b) by 457 days.

(21) Appl. No.: 14/631,355

(22) Filed: Feb. 25, 2015

(65) Prior Publication Data
US 2015/0171821 A1   Jun. 18, 2015

Related U.S. Application Data

(63) Continuation of application No. 13/486,225, filed on Jun. 1, 2012, now Pat. No. 9,048,810.

(30) Foreign Application Priority Data

Jun. 3, 2011 (JP) ................................. 2011-125806
Jan. 11, 2012 (JP) ................................. 2012-002998

(51) Int. Cl.
*H03H 9/17* (2006.01)
*H03H 9/05* (2006.01)
(Continued)

(52) U.S. Cl.
CPC ............. *H03H 9/17* (2013.01); *H01L 41/053* (2013.01); *H03H 9/0542* (2013.01);
(Continued)

(58) Field of Classification Search
CPC ...... H03H 9/17; H03H 9/0542; H03H 9/0552; H03H 9/1021; H01L 41/053
(Continued)

(56) References Cited

U.S. PATENT DOCUMENTS 3,694,677 A   9/1972   Guttwein et al.
4,454,444 A   6/1984   Fujiwara et al.
(Continued)

FOREIGN PATENT DOCUMENTS

JP   59-040715   3/1984
JP   61-187116   11/1986
(Continued)

*Primary Examiner* — Thomas Dougherty
*Assistant Examiner* — Karen B Addison
(74) *Attorney, Agent, or Firm* — Harness, Dickey & Pierce, P.L.C.

(57) ABSTRACT

A piezoelectric vibration element includes a piezoelectric substrate including a thin vibration region and a thick section integrated along three sides excluding one side of the vibration region, excitation electrodes respectively arranged on the front and rear surfaces of the vibration region, and lead electrodes. The thick section includes a first thick section and a second thick section arranged to be opposed to each other across the vibration region and a third thick section connected between proximal ends of the first and second thick sections. The second thick section includes an inclined section connected to the one side of the vibration region, a second thick section main body connected to the other side of the inclined section, and at least one slit for stress relaxation.

18 Claims, 23 Drawing Sheets

(51) Int. Cl.
 *H03H 9/10* (2006.01)
 *H01L 41/053* (2006.01)
(52) U.S. Cl.
 CPC ........ *H03H 9/0552* (2013.01); *H03H 9/1021* (2013.01); *Y10T 29/42* (2015.01)
(58) Field of Classification Search
 USPC ............... 310/320–321, 365–367, 344–348; 331/154, 155, 156
 See application file for complete search history.

(56) References Cited

U.S. PATENT DOCUMENTS

| | | | |
|---|---|---|---|
| 5,185,550 | A | 2/1993 | Morita et al. |
| 5,235,240 | A | 8/1993 | Morita et al. |
| 5,307,034 | A | 4/1994 | Morita et al. |
| 5,436,523 | A | 7/1995 | Staudte |
| 6,750,593 | B2 | 6/2004 | Iwata |
| 6,987,347 | B2 | 1/2006 | Yoshio et al. |
| 7,098,574 | B2 * | 8/2006 | Iwata ............... H03H 3/04 310/320 |
| 7,235,913 | B2 | 6/2007 | Iwata |
| 7,298,069 | B2 * | 11/2007 | Yagishita ............ H03H 9/1021 310/330 |
| 7,436,106 | B2 | 10/2008 | Maruyama |
| 8,026,652 | B2 | 9/2011 | Yasuike |
| 8,234,774 | B2 | 8/2012 | Hagelin et al. |
| 8,791,766 | B2 | 7/2014 | Ishii et al. |
| 2004/0036380 | A1 | 2/2004 | Oda et al. |
| 2008/0048527 | A1 * | 2/2008 | Yoshio .................... H03H 3/04 310/348 |
| 2011/0241790 | A1 | 10/2011 | Amano |
| 2012/0025675 | A1 | 2/2012 | Yasuike |
| 2012/0306321 | A1 * | 12/2012 | Ishii .................... H03H 9/0542 310/348 |
| 2013/0043959 | A1 | 2/2013 | Ishii et al. |
| 2013/0043960 | A1 | 2/2013 | Ishii et al. |
| 2014/0300252 | A1 | 10/2014 | Ishii et al. |

FOREIGN PATENT DOCUMENTS

| | | |
|---|---|---|
| JP | 02-079508 | 3/1990 |
| JP | 03-235409 | 10/1991 |
| JP | 08-084044 | 3/1996 |
| JP | 09-246903 A | 9/1997 |
| JP | 09-326667 | 12/1997 |
| JP | 2000-278080 A | 10/2000 |
| JP | 2001-016069 A | 1/2001 |
| JP | 2001-144578 A | 5/2001 |
| JP | 2001-251160 A | 9/2001 |
| JP | 2001-326554 A | 11/2001 |
| JP | 2002-033640 A | 1/2002 |
| JP | 2002-198772 A | 7/2002 |
| JP | 2002-246869 A | 8/2002 |
| JP | 2003-087087 A | 3/2003 |
| JP | 2003-110388 A | 4/2003 |
| JP | 2003-264446 A | 9/2003 |
| JP | 2004-088138 A | 3/2004 |
| JP | 2004-165743 A | 6/2004 |
| JP | 2004-165798 A | 6/2004 |
| JP | 2004-260695 A | 9/2004 |
| JP | 2005-020141 A | 1/2005 |
| JP | 2005-033293 A | 2/2005 |
| JP | 2005-033294 A | 2/2005 |
| JP | 2005-303825 A | 10/2005 |
| JP | 2005-354588 A | 12/2005 |
| JP | 2006-203700 A | 8/2006 |
| JP | 2007-158486 A | 6/2007 |
| JP | 2007-201858 A | 8/2007 |
| JP | 2007-214941 A | 8/2007 |
| JP | 2007-300416 A | 11/2007 |
| JP | 2007-318350 A | 12/2007 |
| JP | 2009-135856 A | 6/2009 |
| JP | 2009-158999 A | 7/2009 |
| JP | 2009-159000 A | 7/2009 |
| JP | 2009-164824 A | 7/2009 |
| JP | 2009-188483 A | 8/2009 |
| JP | 2009-246583 A | 10/2009 |
| JP | 2010-011222 A | 1/2010 |
| JP | 2010-074840 A | 4/2010 |
| JP | 2010-268498 A | 11/2010 |
| JP | 2011-041113 A | 2/2011 |
| JP | 2011-045112 A | 3/2011 |
| JP | 2011-045113 A | 3/2011 |
| JP | 2011-109681 A | 6/2011 |
| JP | 2012-029262 A | 2/2012 |

\* cited by examiner

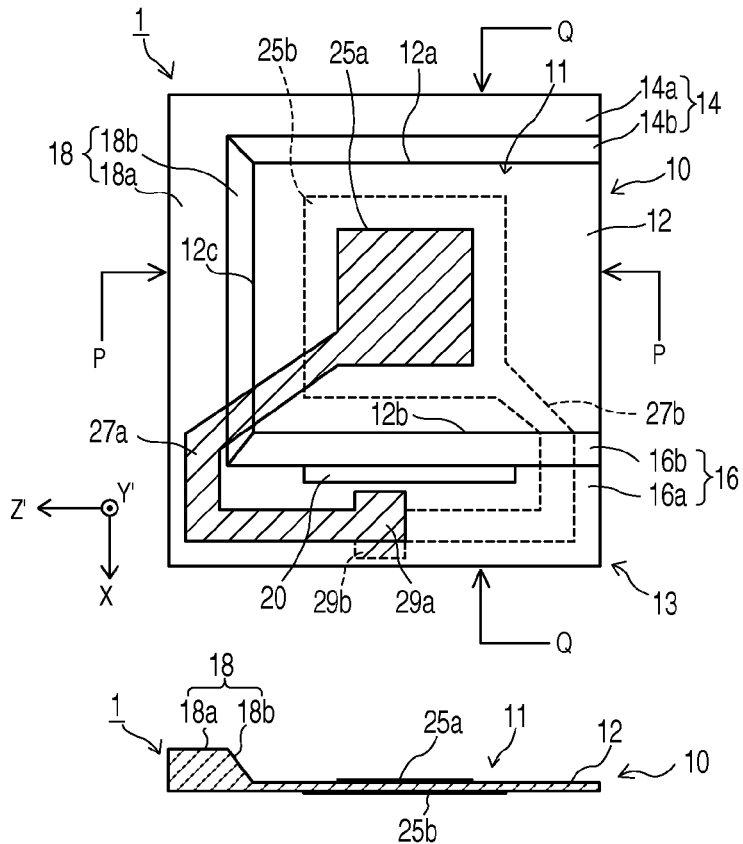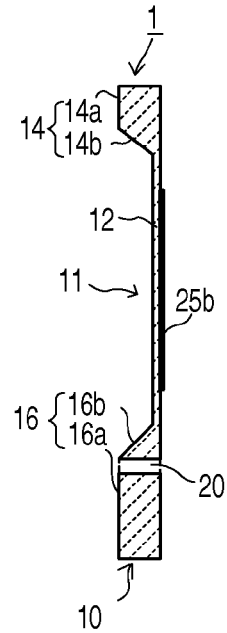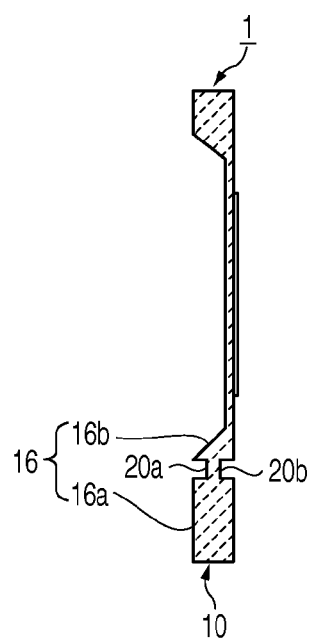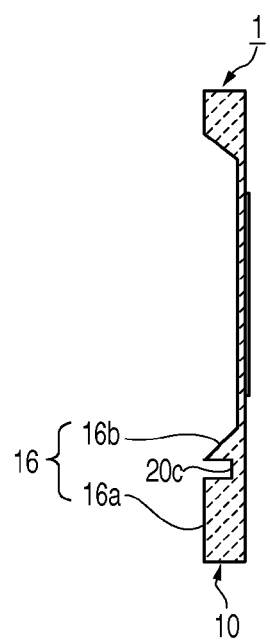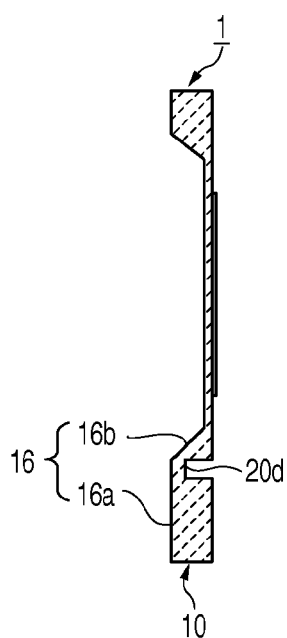

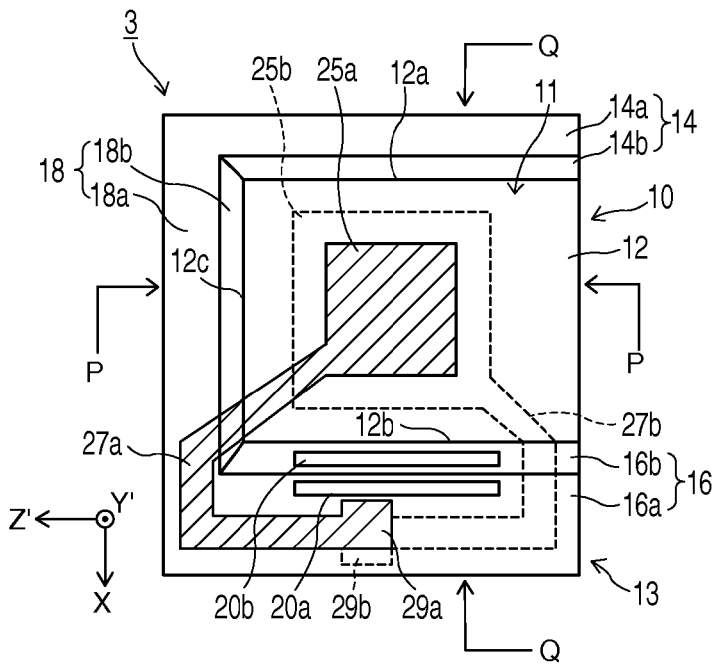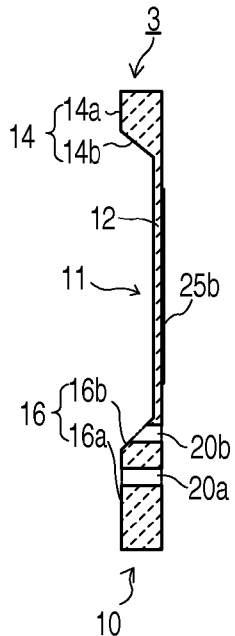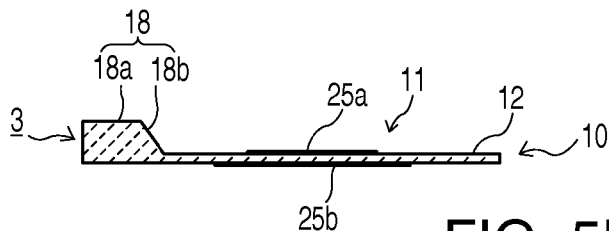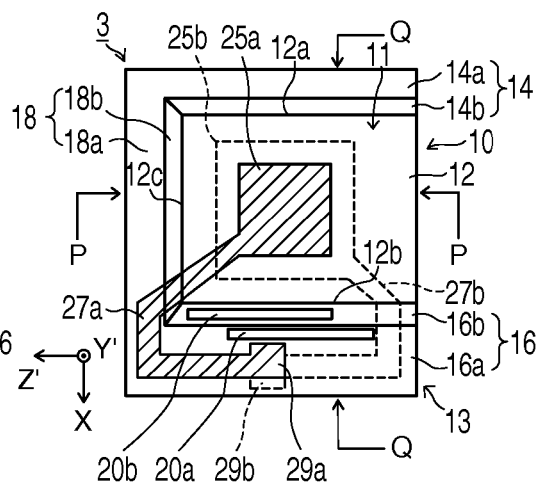
FIG. 5A  FIG. 5C  FIG. 5B  FIG. 5D  FIG. 5E

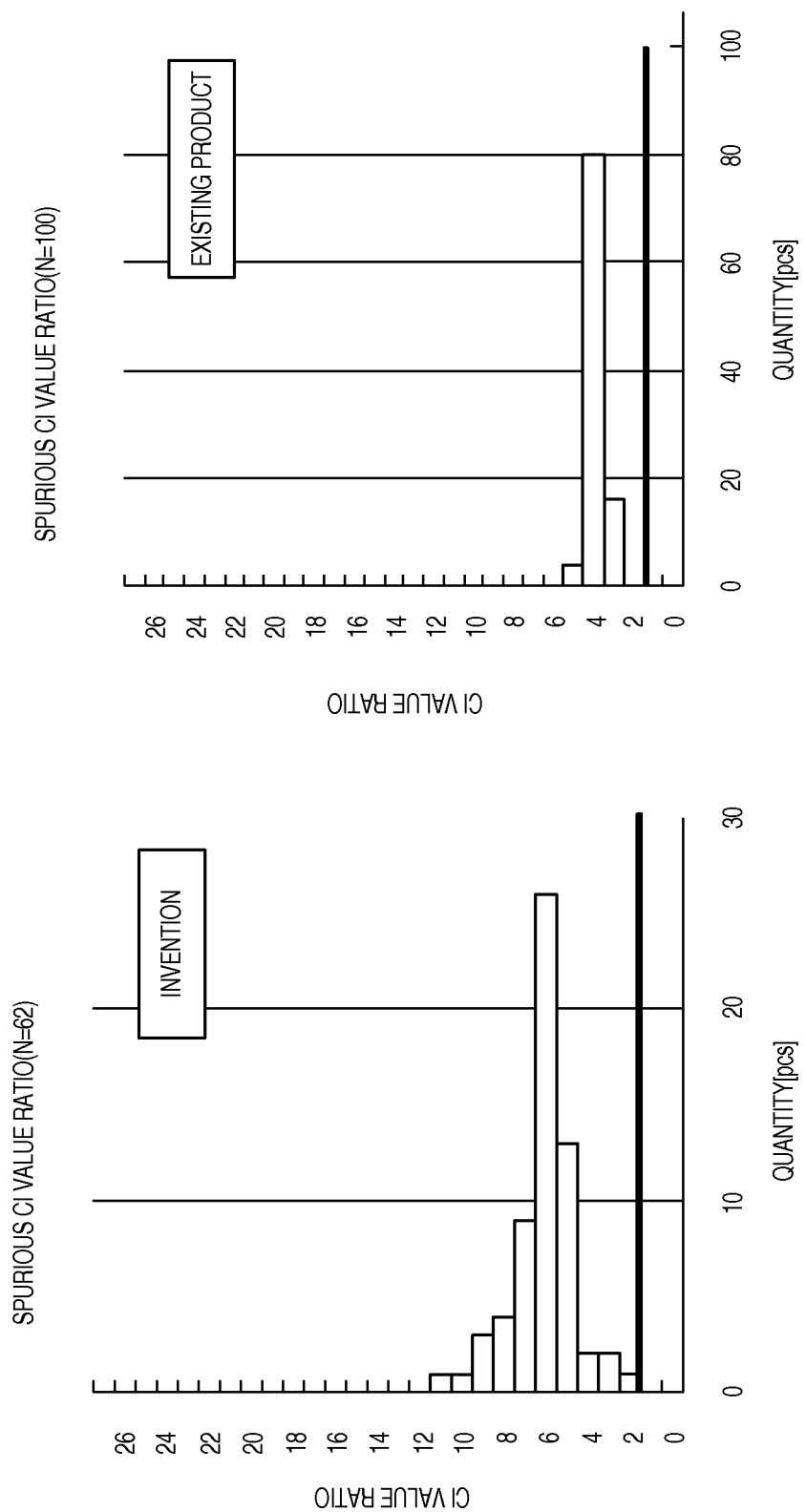

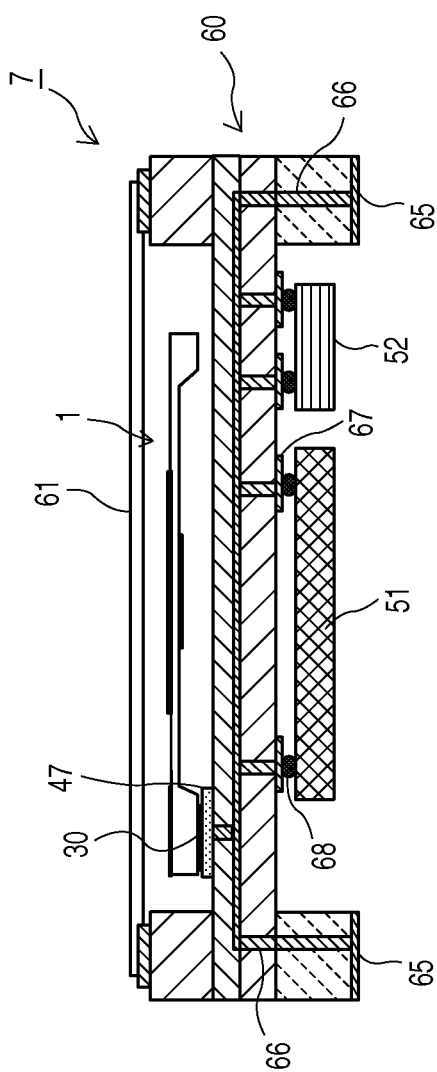
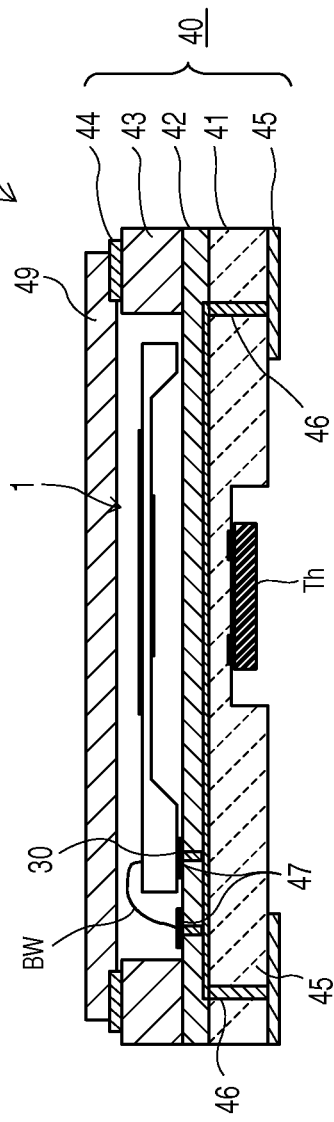
FIG. 18A
FIG. 18B

A-A

PIEZOELECTRIC VIBRATION ELEMENT, MANUFACTURING METHOD FOR PIEZOELECTRIC VIBRATION ELEMENT, PIEZOELECTRIC RESONATOR, ELECTRONIC DEVICE, AND ELECTRONIC APPARATUS

CROSS-REFERENCE TO RELATED APPLICATIONS

This is a continuation patent application of Ser. No. 13/486,225 filed Jun. 1, 2012, which claims priority to Japanese Patent Application No. 2011-125806, filed Jun. 3, 2011 and Japanese Patent Application No. 2012-002998, filed Jan. 11, 2012, all of which are expressly incorporated by reference herein in their entireties.

BACKGROUND

1. Technical Field

The present invention relates to a piezoelectric resonator that excites a thickness shear vibration mode and, more particularly, to a piezoelectric vibration element having a so-called inverted mesa structure, a manufacturing method for the piezoelectric vibration element, a piezoelectric resonator, an electronic device, and an electronic apparatus using the piezoelectric resonator.

2. Related Art

In an AT cut quartz crystal resonator, a vibration mode of main vibration to be excited is thickness shear vibration. The AT cut quartz crystal resonator is suitable for a reduction in size and an increase in frequency and assumes a cubic curve having an excellent frequency-temperature characteristic. Therefore, the AT cut quartz crystal resonator is used in various apparatuses such as a piezoelectric oscillator and an electronic apparatus.

JP-A-2004-165743 discloses an AT cut quartz crystal resonator having a so-called inverted mesa structure in which a recessed section is formed in a part of a principal plane to realize an increase in frequency. In the AT cut quartz crystal resonator, a so-called Z' long substrate having the length in the Z' axis direction of a quartz crystal substrate larger than the length in the X axis direction is used.

JP-A-2009-164824 discloses an AT cut quartz crystal resonator having a so-called inverted mesa structure in which thick supporting sections (thick sections) are respectively connected to three sides of a rectangular thin vibrating sections and the thick sections are provided in a C shape. Further, a quartz crystal vibrating reed is an in-plane rotation AT cut quartz crystal substrate formed by rotating each of the X axis and the Z' axis of an AT cut quartz crystal substrate about the Y' axis in a range of −120° to +60°. The quartz crystal vibrating reed has a structure that secures a vibration region and is excellent in mass production (produced in a large number).

JP-A-2006-203700 and JP-A-2002-198772 disclose an AT cut quartz crystal resonator having an inverted mesa structure in which thick supporting sections are respectively connected to three sides of a rectangular thin vibrating section and the thick sections are provided in a C shape. As a quartz crystal vibration reed, a so-called X long substrate having the length in the X axis direction of a quartz crystal substrate larger than the length in the Z' axis direction is used.

JP-A-2002-033640 discloses an AT cut quartz crystal resonator having an inverted mesa structure in which thick supporting sections are respectively connected to adjacent two sides of a rectangular thin vibrating section and the thick sections are provided in an L shape. As a quartz crystal substrate, a Z' long substrate is used.

However, in JP-A-2002-033640, to obtain the L-shaped thick sections, as shown in FIGS. 1C and 1D of JP-A-2002-033640, the thick sections are removed along a line segment α and a line segment β. The thick sections are removed on condition that the thick sections are removed by machining such as dicing. Therefore, a cut surface is subject to damage such as chipping and crack and an extremely thin section is broken. In a vibration region, for example, an unnecessary vibration occurs and a CI value increases, which cause spurious vibrations.

JP-A-2001-144578 discloses an AT cut quartz crystal resonator having an inverted mesa structure in which a thick supporting section is connected to only one side of a thin vibrating section.

JP-A-2003-264446 discloses an AT cut resonator having an inverted mesa structure in which recessed sections are formed to be opposed to each other on both principal planes, which are front and rear surfaces, of a quartz crystal substrate to realize an increase in frequency. JP-A-2003-264446 proposes a structure in which, as the quartz crystal substrate, an X long substrate is used and an excitation electrode is provided in a region where flatness of a vibration region formed in the recessed section is secured.

Incidentally, it is known that, in a thickness shear vibration mode excited in a vibration region of an AT cut quartz crystal resonator, because of anisotropy of an elastic coefficient, a vibration displacement distribution is an elliptical shape having a long axis in the X axis direction. JP-A-2-079508 discloses a piezoelectric resonator that includes a pair of ring-like electrodes arranged symmetrically on both the front and rear surfaces of a piezoelectric substrate and excites thickness shear vibration. A difference between the diameter of the outer circumference and the diameter of the inner circumference of the ring-like electrode is set such that the ring-like electrode excites only a symmetrical zero-order mode and hardly excites other anharmonic high-order modes.

JP-A-9-246903 discloses a piezoelectric resonator in which both the shapes of a piezoelectric substrate and excitation electrodes provided on the front and the back of the piezoelectric substrate are formed in an elliptical shape.

JP-A-2007-158486 discloses a quartz crystal resonator in which both the shapes of both ends in a longitudinal direction (the X axis direction) of a quartz crystal substrate and both ends in the X axis direction of an electrode area semi-elliptical shape and a ratio of the major axis and the minor axis of the ellipse (the major axis/the minor axis) is set to about 1.26.

JP-A-2007-214941 discloses a quartz crystal resonator in which an elliptical excitation electrode is formed on an elliptical quartz crystal substrate. A ratio of the major axis and the minor axis is desirably 1.26:1. However, JP-A-2007-214941 indicates that, when fluctuation of manufacturing dimensions and the like are taken into account, the ratio is practically in a range of about 1.14 to 1.39:1.

JP-UM-A-61-187116 discloses a piezoelectric resonator having a structure in which a cutout or a slit is provided between a vibrating section and a supporting section in order to further improve an energy confinement effect of a thickness shear piezoelectric resonator.

When a reduction in the size of a piezoelectric resonator is realized, deterioration in an electric characteristic and a frequency aging failure are caused by residual stress due to an adhesive. JP-A-9-326667 discloses a quartz crystal resonator in which a cutout or a slit is provided between a vibrating section and a supporting section of an AT cut quartz crystal resonator having a rectangular flat shape. JP-A-9-326667 indicates that it is possible to suppress, by using such a structure, the residual stress from spreading to a vibration region.

JP-A-2009-158999 discloses a resonator in which a cutout or a slit is provided between a vibrating section and a supporting section of an inverted mesa piezoelectric resonator in order to reduce (relax) mount distortion (stress). JP-A-2004-260695 discloses a piezoelectric resonator in which conduction of electrodes on the front and rear surfaces is secured by providing a slit (a through hole) in a supporting section of an inverted mesa piezoelectric resonator.

JP-A-2009-188483 discloses a quartz crystal resonator in which an unnecessary mode of a high-order contour system is suppressed by providing a slit in a supporting section of an AT cut quartz crystal resonator of a thickness shear vibration mode.

JP-A-2003-087087 discloses a resonator in which spurious vibrations are suppressed by providing a slit in a connected section of a thin vibrating section and a thick retaining section, i.e., a residue section having an inclined plane of an inverted mesa AT cut quartz crystal resonator.

In recent years, there is a strong demand for a reduction in size, an increase in frequency, and improvement of performance of a piezoelectric device. However, it has been found that, in the piezoelectric resonators having the structures explained above, a CI value of main vibration, a near spurious CI value ratio (=CIs/CIm, where CIm is the CI value of the main vibration and CIs is a CI value of spurious vibrations; the near spurious CI value ratio is equal to or larger than 1.8 in one example of a standard), and the like cannot satisfy requirements.

SUMMARY

An advantage of some aspects of the invention is to provide a piezoelectric vibration element, a manufacturing method for the piezoelectric vibration element, a piezoelectric resonator, an electronic device, and an electronic apparatus using the piezoelectric resonator that realize an increase in frequency (100 to 500 MHz bands), reduce a CI value of main vibration, and satisfy electric requirements such as a spurious CI value ratio.

Application Example 1

This application example of the invention is directed to a piezoelectric vibration element including: a piezoelectric substrate that includes a vibration region and a thick section integrated with the vibration region and having thickness larger than the thickness of the vibration region; excitation electrodes respectively arranged on the front surface and the rear surface of the vibration region; and lead electrodes provided extending from the excitation electrodes onto the thick section. The thick section includes, to open a part of the vibration region, a first thick section and a second thick section arranged across the vibration region and a third thick section that connects proximal ends of the first thick section and the second thick section. The second thick section includes an inclined section having thickness increasing as the inclined section separates further away from one end edge connected to the vibration region toward the other end edge and a thick main body connected to the other end edge of the inclined section. A slit is provided in the second thick section.

A high-frequency fundamental wave piezoelectric vibration element is reduced in size and the spread of stress due to bonding and fixing can be suppressed. Therefore, there is an effect that it is possible to obtain a piezoelectric vibration element excellent in a frequency-temperature characteristic, a CI temperature characteristic, and a frequency aging characteristic and having a small CI value of main vibration and a large ratio of a CI value of near spurious vibrations to the CI value of the main vibration, i.e., a large CI value ratio.

Application Example 2

This application example of the invention is directed to the piezoelectric vibration element of Application Example 1, wherein the vibration region is rectangular, and one side among four sides of the vibration region is opened.

Since the one side among the four sides of the vibration region is opened, a thick section in the direction of the one side is not formed. Therefore, it is possible to reduce the piezoelectric vibration element in size.

Application Example 3

This application example of the invention is directed to the piezoelectric vibration element of Application Example 1, wherein the slit is arranged in the thick main body along a boundary between the inclined section and the thick main body.

Since the spread of stress caused in bonding and fixing the piezoelectric vibration element can be suppressed, there is an effect that it is possible to obtain a piezoelectric vibration element excellent in a frequency-temperature characteristic, a CI temperature characteristic, and a frequency aging characteristic.

Application Example 4

This application example of the invention is directed to the piezoelectric vibration element of Application Example 1, wherein the slit is arranged in the inclined section to separate from one side of the vibration region.

Since it is easy to form the slit and the spread of stress caused in bonding and fixing the piezoelectric vibration element can be suppressed, there is an effect that it is possible to obtain a piezoelectric vibration element excellent in a frequency-temperature characteristic and a CI temperature characteristic.

Application Example 5

This application example of the invention is directed to the piezoelectric vibration element of Application Example 1, wherein the slit includes a first slit arranged in the thick main body and a second slit arranged in the inclined section to separate from one side of the vibration region.

Since the spread of stress caused in bonding and fixing the piezoelectric element can be better suppressed, there is an effect that it is possible to obtain a piezoelectric vibration element excellent in frequency reproducibility, a frequency-temperature characteristic, a CI temperature characteristic, and a frequency aging characteristic.

Application Example 6

This application example of the invention is directed to the piezoelectric vibration element of any of Application Examples 1 to 5, wherein one principal plane of the vibration region and one surfaces of the first, second, and third thick sections are present in the same plane.

When the piezoelectric substrate is etched only from one surface to form the vibration region, it is possible to form a vibration region that keeps a cutting angle of the original substrate. Therefore, there is an effect that it is possible to obtain a high-frequency fundamental wave piezoelectric vibration element excellent in a frequency-temperature characteristic.

Application Example 7

This application example of the invention is directed to the piezoelectric vibration element of any of Application Examples 1 to 6, wherein the piezoelectric substrate is a quartz crystal substrate that has an orthogonal coordinate system including an X axis serving as an electrical axis, a Y axis serving a mechanical axis, and a Z axis serving as an optical axis, which are crystal axes of quartz crystal, has, as a Z' axis, an axis obtained by tilting the Z axis in a −Y direction of the Y axis by a predetermined angle about the X axis, has, as a Y' axis, an axis obtained by tilting the Y axis in a +Z direction of the Z axis by the predetermined angle about the X axis, includes a surface parallel to the X axis and the Z' axis, and has thickness in a direction parallel to the Y' axis and is a quartz crystal substrate that has a side parallel to the X axis as a long side and has a side parallel to the Z' axis as a short side.

There is an effect that it is possible to obtain a piezoelectric vibration element having a satisfactory temperature characteristic.

Application Example 8

This application example of the invention is directed to the piezoelectric vibration element of Application Example 7, wherein the quartz crystal substrate is an AT cut quartz crystal substrate.

By using the AT cut quartz crystal substrate as the piezoelectric substrate, it is possible to utilize achievements and experiences in many years concerning photolithography and etching. Therefore, there is an effect that mass production of the piezoelectric substrate is possible and, moreover, highly accurate etching can be performed, and the yield of the piezoelectric vibration element is substantially improved.

Application Example 9

This application example of the invention is directed to a manufacturing method for a piezoelectric vibration element including: providing a recessed section that includes a vibration region on one surface of the front and rear surfaces of a piezoelectric substrate; removing the piezoelectric substrate that includes a part of the recessed section and forming an external shape that includes the vibration region, which includes a thick section in which a part of the recessed section is opened, and a slit; and forming an electrode in a predetermined region that includes the front and rear surfaces of the vibration region.

With the manufacturing method for a piezoelectric vibration element, there is an effect that it is possible to easily manufacture a piezoelectric vibration element excellent in a frequency-temperature characteristic, a CI temperature characteristic, and a frequency aging characteristic and having a small CI value of main vibration and a large ratio of a CI value of near spurious vibrations to the CI value of the main vibration, i.e., a large CI value ratio.

Application Example 10

This application example of the invention is directed to a piezoelectric resonator including the piezoelectric vibration element of any of Application Examples 1 to 8 and a package that houses the piezoelectric element.

A high-frequency fundamental wave piezoelectric resonator is reduced in size and the spread of stress due to bonding and fixing can be suppressed. Therefore, there is an effect that it is possible to obtain a piezoelectric resonator excellent in frequency reproducibility, a frequency-temperature characteristic, a CI temperature characteristic, and a frequency aging characteristic. Further, there is an effect that it is possible to obtain a piezoelectric resonator having a small CI value of main vibration and a large ratio of a CI value of near spurious vibrations to the CI value of the main vibration, i.e., a large CI value ratio and having a small capacity ratio.

Application Example 11

This application example of the invention is directed to an electronic device including, in a package, the piezoelectric vibration element of any of Application Examples 1 to 8 and an electronic component.

By configuring the electronic device (e.g., a voltage controlled crystal oscillator) as explained above, there is an effect that it is possible to obtain a voltage controlled crystal oscillator excellent in frequency reproducibility, a frequency-temperature characteristic, and an aging characteristic having a small size and a high frequency (e.g., a 490 MHz band). Since the fundamental wave piezoelectric vibration element is used in the electronic device, there is an effect that it is possible to obtain a voltage controlled crystal oscillator having a small capacity ratio, a wide range of frequency variable width, and a satisfactory S/N ratio.

Application Example 12

This application example of the invention is directed to the electronic component of Application Example 11, which is any of a variable capacity element, a thermistor, an inductor, and a capacitor.

By configuring the electronic device as explained above, it is possible to configure electronic devices such as piezoelectric oscillator, a temperature compensated piezoelectric oscillator, and a voltage controlled crystal oscillator. There is an effect that it is possible to obtain a piezoelectric oscillator excellent in frequency reproducibility and an aging characteristic, a temperature compensated piezoelectric oscillator excellent in a frequency-temperature characteristic, and a voltage controlled crystal oscillator having a stable frequency, a wide variable range, and a satisfactory S/N ratio (a signal to noise ratio).

Application Example 13

This application example of the invention is directed to an electronic device including, in a package, the piezoelectric vibration element of any of Application Examples 1 to 8 and an oscillation circuit that excites the piezoelectric vibration element.

By configuring the electronic device as explained above, there is an effect that it is possible to configure an electronic device such as a piezoelectric oscillator excellent in frequency reproducibility and an aging characteristic.

Application Example 14

This application Example of the invention is directed to an electronic apparatus including the piezoelectric resonator of Application Example 9.

By using the piezoelectric resonator in the electronic apparatus, there is an effect that it is possible to configure an electronic apparatus including a reference frequency source having a high frequency, excellent in frequency stability, and having a satisfactory S/N ratio.

BRIEF DESCRIPTION OF THE DRAWINGS

The invention will be described with reference to the accompanying drawings, wherein like numbers reference like elements.

FIGS. 1A to 1F are schematic diagrams showing the structure of a piezoelectric vibration element according to a first embodiment, wherein FIG. 1A is a plan view, FIG. 1B is a P-P sectional view, FIG. 1C is a Q-Q sectional view, and FIGS. 1D to 1F are Q-Q sectional views showing modifications of a slit shape.

FIGS. 4A to 4C are schematic diagrams showing the structure of a piezoelectric vibration element according to a second embodiment, wherein FIG. 4A is a plan view, FIG. 4B is a P-P sectional view, and FIG. 4C is a Q-Q sectional view.

FIGS. 5A to 5E are schematic diagrams showing the structure of a piezoelectric vibration element according to a third embodiment, wherein FIG. 5A is a plan view, FIG. 5B is a P-P sectional view, FIG. 5C is a Q-Q sectional view, and FIGS. 5D and 5E are plan views showing other configuration examples.

FIGS. 10A and 10B show the configuration of a piezoelectric resonator according to a fourth embodiment, wherein FIG. 10A is a longitudinal sectional view and FIG. 10B is a plan view from a P direction.

FIGS. 11A and 11B show the configuration of a piezoelectric resonator according to a fifth embodiment, wherein FIG. 11A is a longitudinal sectional view and FIG. 11B is a plan view from a P direction.

FIGS. 12A and 12B show characteristics of the piezoelectric resonator, wherein FIG. 12A is a graph showing a frequency-temperature characteristic of the piezoelectric resonator and FIG. 12B is a graph showing a CI temperature characteristic.

FIGS. 13A to 13D show characteristics of the piezoelectric resonator, wherein FIGS. 13A and 13B are graphs showing a distribution characteristic of a capacity ratio and FIGS. 13C and 13D are graphs showing a distribution characteristic of capacitance.

FIGS. 14A and 14B show characteristics of the piezoelectric resonator, wherein FIGS. 14A and 14B are graphs showing distribution characteristics of a CI value ratio of the piezoelectric resonator.

FIGS. 15A to 15C show a modification of a piezoelectric vibration element, wherein FIGS. 15A and 15B are perspective views and FIG. 15C is a longitudinal sectional view.

FIGS. 17A and 17B show the configuration of an electronic device according to a sixth embodiment, wherein FIG. 17A is a longitudinal sectional view and FIG. 17B is a plan view from a P direction.

FIGS. 18A and 18B show the configuration of an electronic device according to a seventh embodiment, wherein FIGS. 18A and 18B are longitudinal sectional views.

FIGS. 20A to 20C show an application example of the piezoelectric substrate, wherein FIGS. 20A to 20C are explanatory diagrams of the configuration of the piezoelectric substrate.

FIGS. 21A to 21C show an application example of the piezoelectric substrate, wherein FIGS. 21A to 21C are explanatory diagrams of the configuration of the piezoelectric substrate.

DESCRIPTION OF EXEMPLARY EMBODIMENTS

First Embodiment

Figure 2:
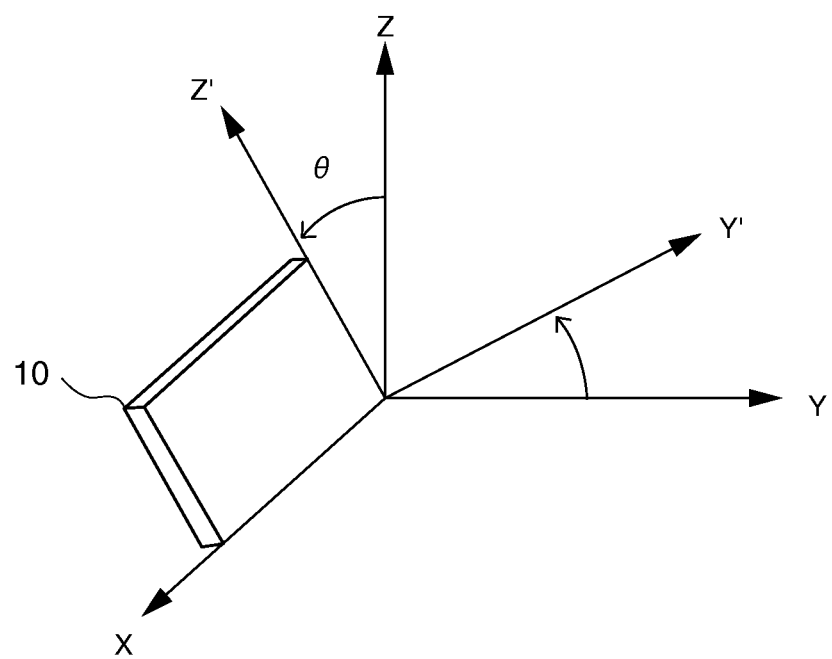
FIG. 2 is a diagram for explaining a relation between an AT cut quartz crystal substrate and crystal axes.

Embodiments of the invention are explained in detail below with reference to the accompanying drawings. FIGS. 1A to 1F are schematic diagrams showing the configuration of a piezoelectric vibration element according to a first embodiment of the invention. FIG. 1A is a plan view of a piezoelectric vibration element 1, FIG. 1B is a P-P sectional view of the piezoelectric vibration element 1, FIG. 1C is a Q-Q sectional view of the piezoelectric vibration element 1, and FIGS. 1D, 1E, and 1F are Q-Q sectional views showing modifications of a slit shape.

The piezoelectric vibration element 1 includes a piezoelectric substrate 10 including a thin vibration region 12 and thick sections 14, 16, and 18 connected to the vibration region 12, oscillation electrodes 25a and 25b formed to be respectively opposed to the front and the back on both principal planes of the vibration region 12, and lead electrodes 27a and 27b formed to be respectively extended from the excitation electrodes 25a and 25b to pad electrodes 29a and 29b respectively provided in the thick sections.

The piezoelectric substrate 10 includes the vibration region 12 that is substantially quadrangular, formed in a rectangular shape, and thin and flat and a C-shaped thick section (thick supporting section) 13 integrated along three sides excluding one side of the vibration region 12. The thick section 13 includes a C-shaped configuration including a first thick section 14 and a second thick section 16 arranged to be opposed to each other across the vibration region 12 and a third thick section 18 that connects proximal ends of the first thick section 14 and the second thick section 16.

In other words, to open one side among four sides of the vibration region 12 (a part of the vibration region 12), the thick section 13 includes the first thick section 14 and the second thick section 16 arranged to be opposed to each other across the vibration region 12 and the third thick section 18 that connects the proximal ends of the first thick section 14 and the second thick section 16. "Open" includes meaning that the one side is exposed and meaning that the vibration region 12 is completely exposed rather than being exposed in a part.

In this specification, a recessed section 11 side is set as the front surface and a flat surface, which is a surface on the opposite side of the front surface, is the rear surface.

The first thick section 14 includes a first inclined section 14b connected to one side 12a of the thin flat vibration region 12 and having thickness gradually increasing as the first inclined section 14b separates further away from one end edge connected to the one side 12a of the vibration region 12 toward the other end edge and a first thick section main body 14a having a thick square pole shape connected to the other end edge of the first inclined section 14b. Similarly, the second thick section 16 includes an inclined section 16b connected to one side 12b of the thin flat vibration region 12 and having thickness gradually increasing as the inclined section 16b separates further away from one end edge connected to the one side 12b of the vibration region 12 toward the other end edge and a second thick section main body 16a having a thick square pole shape connected to the other end edge of the inclined section 16b.

The thick main body sections mean regions having fixed thickness parallel to the Y' axis.

The third thick section 18 includes a third inclined section 18b connected to one side 12c of the thin flat vibration region 12 and having thickness gradually increasing as the third inclined section 18b separates further away from one end edge connected to the one side 12c of the vibration region 12 toward the other end edge and a third thick section main body 18a having a thick square pole shape connected to the other end edge of the third inclined section 18b. In other words, the thin vibration region 12 is formed as the recessed section 11, three sides of which are surrounded by the first, second, and third thick sections 14, 16, and 18 and the other one side of which is opened.

One principal plane of the vibration region 12 and one surfaces of the respective first, second, and third thick sections 14, 16, and 18 are present on the same plane, i.e., on an X-Z' plane of coordinate axes shown in FIG. 1A. This surface (the lower surface side in FIG. 1B) is referred to as even surface and a surface on the opposite side (the upper surface side in FIG. 1B) is referred to as recessed surface.

Further, in the piezoelectric substrate 10, at least one slit 20 for stress relaxation is formed to pierce through the second thick section 16. In the embodiment shown in FIGS. 1A to 1F, the slit 20 is formed in the plane of the second thick section main body 16a along a connecting section of the inclined section 16b and the second thick section main body 16a.

The slit 20 is not limited to the slit formed to pierce through the second thick section 16 as shown in FIG. 1C and may be a groove-like slit having a bottom. More specifically, for example, as shown in FIG. 1D, the groove-like slit may be formed by slits provided from both the front and rear surface sides, i.e., a first slit 20a formed from the front surface side of the second thick section 16 and having a bottom and a second slit 20b formed from the rear surface side of the second thick section 16 and having a bottom. As shown in FIG. 1E, the groove-like slit may be formed by a third slit 20c formed from the front surface side of the second thick section 16 and having a bottom. As shown in FIG. 1F, a fourth slit 20d formed from the rear surface side of the second thick section 16 and having a bottom may be provided.

The shape of the slit 20 explained above is also applicable in other embodiments, modifications, and application examples explained below.

A piezoelectric material such as quartz crystal belongs to a trigonal system and has crystal axes X, Y, and Z orthogonal to one another as shown in FIG. 2. The X axis, the Y axis, and the Z axis are respectively referred to as electrical axis, mechanical axis, and optical axis. A flat plate sliced from quartz crystal along a plane obtained by rotating an XZ plane of a quartz crystal substrate about the X axis by a predetermined angle $\theta$ is used as a piezoelectric vibration element. For example, in the case of an AT cut quartz crystal plate 101, $\theta$ is about 35° 15'. The Y axis and the Z axis are also rotated about the X axis by $\theta$ to be respectively changed to a Y' axis and a Z' axis. Therefore, the AT cut quartz crystal substrate 101 has the orthogonal axes X, Y', and Z'. In the AT cut quartz crystal substrate 101, the thickness direction is the Y' axis, a XZ' plane (a surface including the X axis and the Z' axis) orthogonal to the Y' axis is a principal plane, and thickness shear vibration is excited as main vibration. The piezoelectric substrate 10 can be obtained by machining the AT cut quartz crystal substrate 101.

Specifically, as shown in FIG. 2, the piezoelectric substrate 10 is formed by an AT cut quartz crystal substrate that has an orthogonal coordinate system including the X axis (the electrical axis), the Y axis (the mechanical axis), and the Z axis (the optical axis), has, as the Z' axis, an axis obtained by tilting the Z axis in a −Y direction of the Y axis about the X axis, has, as the Y' axis, an axis obtained by tilting the Y axis in a +Z direction of the Z axis about the X axis, includes a surface parallel to the X axis and the Z' axis, and has thickness in a direction parallel to the Y' axis.

The piezoelectric substrate according to the invention is not limited to the AT cut at the angle $\theta$ of about 35° 15'. It goes without saying that the piezoelectric substrate can be widely applied to piezoelectric substrates of BT cut and the like that excites thickness shear vibration.

As shown in FIG. 1A, the piezoelectric substrate 10 has a rectangular shape in which a direction parallel to the Y' axis (hereinafter referred to as "Y' axis direction") is a thickness direction, a direction parallel to the X axis (hereinafter referred to as "X axis direction") is a long side, and a direction parallel to the Z' axis (hereinafter referred to as "Z' axis direction") is a short side.

In the embodiment shown in FIGS. 1A to 1F, the excitation electrodes 25a and 25b that drive the piezoelectric substrate 10 have a square shape. The excitation electrodes 25a and 25b are formed to be opposed to both the front and rear surfaces (front and rear principal planes) substantially in the center of the vibration region 12. The size of the excitation electrode 25b on a flat surface side (hereinafter also referred to as "even surface side"; the rear surface side in FIG. 1B) is set substantially large with respect to the size of the excitation electrode 25a on the recessed surface side (the upper surface side in FIG. 1B). This is for the purpose of preventing an energy confinement coefficient by a mass effect of an excitation electrode from being set larger than necessary. In other words, by setting the excitation electrode 25b on the even surface side sufficiently large, a plate back amount $\Delta(=(fs-fe)/fs$, where fs is a cutoff frequency of a piezoelectric substrate and fe is a frequency obtained when an excitation electrode is deposited over the entire surface of the piezoelectric substrate) depends only on a mass effect of the excitation electrode 25a on the recessed surface side.

To form the excitation electrodes 25a and 25b, for example, a nickel (Ni) film is formed on a base and a gold (Au) film is formed over the nickel film using an evaporation apparatus, a sputter apparatus, or the like. The thickness of gold (Au) is desirably thickness for setting only main vibration in a confinement mode (S0) and not setting oblique symmetry inharmonic modes (A0, A1, . . . ) and symmetry inharmonic modes (S1, S3, . . . ) in the confinement mode in a range in which an ohmic loss does not increase. However, for example, in a piezoelectric vibration element in the 490 MHz band, when the golf film is formed to avoid an ohmic loss of electrode film thickness, it is inevitable that a low-order inharmonic mode is confined to some extent.

The excitation electrode 25a formed on the recessed surface side is conducted and connected from the vibration region 12 to the pad electrode 29a, which is formed on the upper surface of the second thick section main body 16a, by the lead electrode 27a arranged extending from the excitation electrode 25a through the third inclined section 18b and the third thick section main body 18a. The excitation electrode 25b formed on the even surface side is conducted and connected to the pad electrode 29b, which is formed on the rear surface (the lower surface) of the second thick section main body 16a, by the lead electrode 27b extending through an end edge section of the piezoelectric substrate 10.

The embodiment shown in FIG. 1A is an example of a draw-out structure of the lead electrodes 27a and 27b. The lead electrode 27a may extend through other thick sections. However, the length of the lead electrodes 27a and 27b is desirably the smallest. It is desirable to suppress an increase in capacitance by giving consideration such that the lead electrodes 27a and 27b do not cross each other across the piezoelectric substrate 10.

In the example explained in the embodiment shown in FIGS. 1A to 1F, the pad electrodes 29a and 29b are respectively formed on the front and rear (upper and lower) surfaces of the piezoelectric substrate 10. However, when the piezoelectric vibration element 1 is housed in a package, it is advisable to revere the piezoelectric vibration element 1, mechanically fix and electrically connect the pad electrode 29a and a terminal electrode of the package using a conductive adhesive, and electrically connect the pad electrode 29b and the terminal electrode of the package using a bonding wire. When a region where the piezoelectric vibration element 1 is supported is one point in this way, it is possible to reduce stress caused by the conductive adhesive.

Further, a piezoelectric oscillator may be configured by mounting an oscillation circuit, for example, an IC chip for driving the piezoelectric vibration element 1 on the inside of the package and electrically connecting an electrode pad, which is electrically connected to the IC chip, and the terminal electrode. It is advisable to fix and connect the pad electrode 29a and a terminal electrode of the package using the conductive adhesive and connect the pad electrode 29b and the connection terminal of the IC chip using the bonding wire. When a region where the piezoelectric element 1 is supported is one point in this way, it is possible to reduce stress caused by the conductive adhesive.

The pad electrodes 29a and 29b may be arranged side by side to be spaced from each other on the rear surface side of the piezoelectric substrate 10. When the pad electrodes 29a and 29b and the terminal electrode of the package in which the piezoelectric vibration element 1 is housed are conducted and connected using the conductive adhesive, the configuration in which the pad electrodes 29a and 29b are arranged side by side to be spaced apart from each other on the rear surface side of the piezoelectric substrate is desirable.

The slit 20 is provided between the vibration region 12 and the pad electrodes 29a and 29b, which are the thick sections of the piezoelectric vibration element 1, to prevent the spread of stress caused during hardening of the conductive adhesive.

Specifically, when the piezoelectric vibration element 1 is supported in the package using the conductive adhesive, first, the conductive adhesive is applied to the pad electrode 29a (a supported section) of the second thick section main body 16a. The pad electrode 29a is placed on the terminal electrode of the package or the like and pressed a little. The pad electrode 29a is retained at high temperature for a predetermined time in order to harden the conductive adhesive. In the high-temperature state, both of the second thick section main body 16a and the package expand and the adhesive temporarily softens. Therefore, stress does not occur in the second thick section main body 16a. After the conductive adhesive hardens, when the second thick section main body 16a and the package are cooled and the temperature thereof returns to the normal temperature (25° C.), stress caused from the hardened conductive adhesive spreads from the second thick section main body 16a to the first and third thick sections 14 and 18 and the vibration region 12 according to a difference among coefficients of linear expansion of the conductive adhesive, the package, and the second thickness section main body 16a. The slit 20 for stress relaxation is provided in order to prevent the spread of the stress.

In order to calculate a stress ($\propto$ distortion) distribution caused in the piezoelectric substrate 10, in general, a simulation is performed using a finite element method. As stress in the vibration region 12 is smaller, a piezoelectric vibration element more excellent in a frequency-temperature characteristic, frequency reproducibility, and a frequency aging characteristic can be obtained.

As the conductive adhesive, there are a silicone conductive adhesive, an epoxy conductive adhesive, a polyimide conductive adhesive, a bismaleimide conductive adhesive, and the like. However, the polyimide conductive adhesive is used taking into account frequency aging due to degassing of the piezoelectric vibration element 1. Since the polyimide conductive adhesive is hard, the magnitude of caused stress can be further reduced by supporting one place than supporting distant two places. Therefore, a structure for supporting in one place is used for the piezoelectric vibration element 1 for a voltage controlled crystal oscillator (VCXO) in, for example, the 490 MHz band among high-frequency bands of 100 to 500 MHz. Specifically, the pad electrode 29b is mechanically fixed and electrically connected to a terminal electrode A of the package using the conductive adhesive and the other pad electrode 29a is electrically connected to a terminal electrode B of the package using the bonding wire.

The piezoelectric substrate 10 shown in FIGS. 1A to 1F is so-called X long in which the length in the X axis direction is larger than the length in the Z' axis direction. In the X long, although stress occurs when the piezoelectric substrate 10 is fixed and connected by the conductive adhesive or the like, as it is well known, if a frequency change that occurs when force is applied to both ends of an AT cut quartz crystal substrate along the X axis direction and a frequency change that occurs when the same force is applied to both ends along the Z' axis direction are compared, the frequency change is smaller when the force is applied to both the ends in the Z' axis direction. This is desirable because a frequency change due to stress is smaller when a supporting point is provided along the Z' axis direction.

Modifications of the Piezoelectric Vibration Element

Figure 3A:
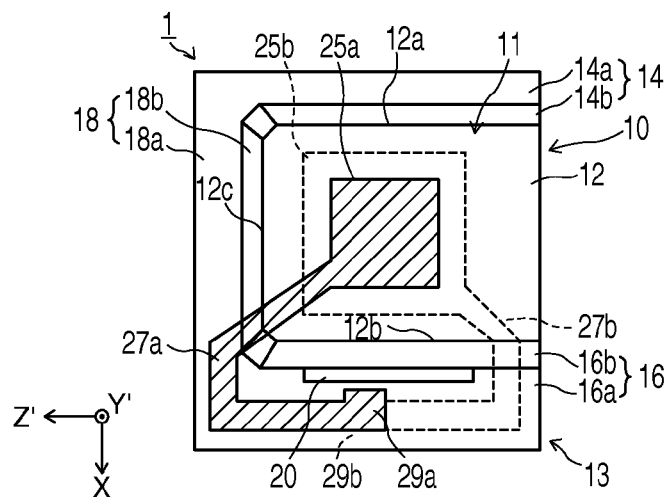
FIGS. 3A to 3C are plan views showing the configurations of modifications of the piezoelectric vibration element.
Figure 3B:
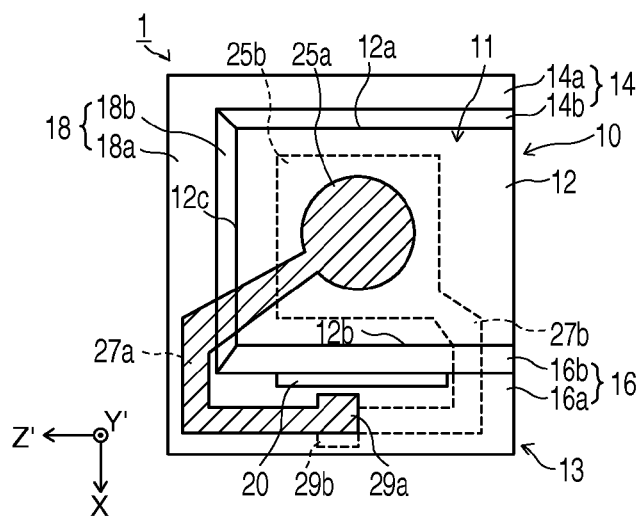
Figure 3C:
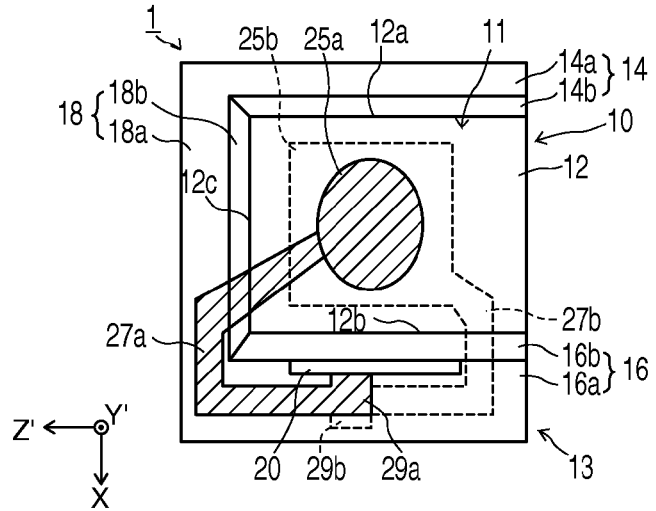

FIGS. 3A to 3C are modifications of the piezoelectric vibration element 1 according to the embodiment shown in FIGS. 1A to 1F. Only plan views are shown in FIGS. 3A to 3C. In the embodiment shown in FIGS. 1A to 1F, the thin vibration region 12 is literally formed in a quadrangular shape (a rectangular shape). However, the modification shown in FIG. 3A is different from the embodiment in that both corner sections equivalent to both ends of one side 12c corresponding to the third thick section 18 of the thin vibration region 12 are chamfered. As opposed to the piezoelectric substrate 10 in which the thin vibration region 12 is literally formed in the quadrangular shape, the piezoelectric substrate 10 having a structure in which corners of the vibration region 12 are chamfered as in the modification shown in FIG. 3A is considered to be included in the concept of a substantially quadrangular shape.

In the embodiment shown in FIGS. 1A to 1F and the modification shown in FIG. 3A, a quadrangular shape, i.e., a square shape or a rectangular shape (the X axis direction is a long side) is shown as an example of the shape of the excitation electrodes 25a and 25b. However, it is unnecessary to limit the shape of the excitation electrodes 25a and 25b to this. In the modification shown in FIG. 3B, the excitation electrode 25a on the recessed surface side (the front surface side) is formed in a circular shape and the excitation electrode 25b on the even surface side (the rear surface side) is formed in a quadrangular shape sufficiently larger than the excitation electrode 25a. The excitation electrode 25b on the even surface side (the rear surface side) may also be formed in a sufficiently large circular shape.

In the modification shown in FIG. 3C, the excitation electrode 25a on the recessed surface side (the front surface side) is formed in an elliptical shape and the excitation electrode 25b on the even surface side (the rear surface side) is formed in a quadrangular shape sufficiently larger than the excitation electrode 25a. A displacement distribution in the X axis direction and a displacement amount in the Z' axis direction are different according to anisotropy of an elastic coefficient. A cut section formed by cutting the displacement distribution along a surface parallel to the X-Z' plane is formed in an elliptical shape. Therefore, when the elliptical excitation electrode 25a is used, the piezoelectric vibration element 1 can be driven most efficiently. In other words, a capacity ratio γ(=C0/C1, where C0 is capacitance and C1 is series resonant capacitance) of the piezoelectric element 1 can be minimized. The excitation electrode 25a may be formed in an elliptical shape.

Second Embodiment

Figure 4A:
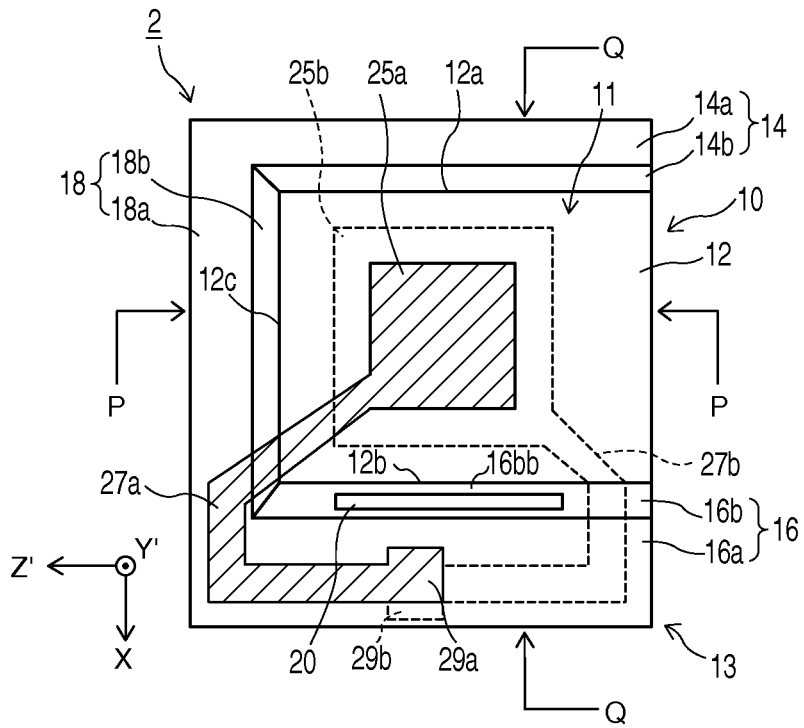
Figure 4C:
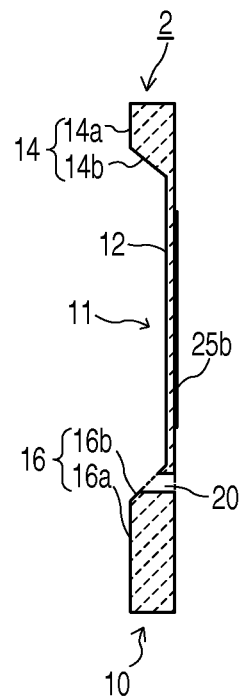
Figure 4B:
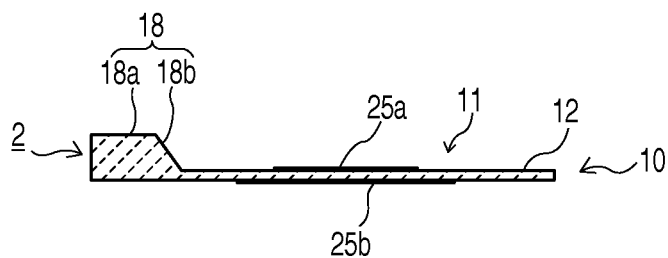

FIGS. 4A to 4C are schematic diagrams showing the configuration of a piezoelectric vibration element according to a second embodiment. FIG. 4A is a plan view of the piezoelectric vibration element, FIG. 4B is a P-P sectional view of the piezoelectric vibration element, and FIG. 4C is a Q-Q sectional view of the piezoelectric vibration element.

A piezoelectric vibration element 2 is different from the piezoelectric vibration element 1 in a position where the slit 20 for stress relaxation is provided. In this example, the slit 20 is formed in the inclined section 16b separating from the end edge of the one side 12b of the thin vibration region 12. The slit 20 is provided separating from both the end edges of the inclined section 16b rather than being formed in the inclined section 16b along the one side 12b of the vibration region 12 such that one end edge of the slit 20 is in contact with the one side 12b. An extremely thin inclined section 16bb connected to the end edge of the one side 12b of the vibration region 12 is left in the inclined section 16b. In other words, the extremely thin inclined section 16bb is formed between the one side 12b and the slit 20.

A reason for leaving the extremely thin inclined section 16bb is as explained below. When the vibration region is excited by applying a high-frequency voltage to the excitation electrodes 25a and 25b arranged in the vibration region 12, the inharmonic modes (A0, S1, A1, S2, . . . ) are excited besides the main vibration (S0). What is desirable is to set only the main vibration (S0) mode as a confinement mode and set the other inharmonic modes in a propagation mode (a non-confinement mode). However, if the vibration region 12 becomes thin and a fundamental wave frequency of the vibration region 12 reaches several hundred megahertz, in order to prevent an ohmic loss of an electrode film, it is necessary to form an excitation electrode in thickness equal to or larger than predetermined thickness. Therefore, when the thickness of the excitation electrode is set to be equal to or larger than the predetermined thickness, a low-order inharmonic mode near the main vibration is excited. The inventor of this application has come to realize that, to suppress the magnitude of the amplitude of the low-order inharmonic mode, conditions under which a standing wave of the inharmonic mode holds only have to be prevented. In other words, the inventor has realized that, since the shape of both end edges in the Z' axis direction of the vibration region 12 shown in FIGS. 4A to 4B is asymmetrical and the shape of both end edges in the X axis direction is also asymmetrical because the thin piece 16bb is left, the amplitude of the standing wave of the low-order inharmonic mode is suppressed.

Third Embodiment

FIGS. 5A to 5E are schematic diagrams showing the configuration of a piezoelectric vibration element according to a third embodiment. FIG. 5A is a plan view of the piezoelectric vibration element, FIG. 5B is a P-P sectional view of the piezoelectric vibration element, FIG. 5C is a Q-Q sectional view of the piezoelectric vibration element, and FIG. 5D is a plan view of the piezoelectric vibration element.

A piezoelectric vibration element 3 is different from the piezoelectric vibration element 1 shown in FIGS. 1A to 1F in that the first slit 20a is provided in the plane of the second thick section main body 16a and the second slit 20b is formed in the plane of the inclined section 16b to provide the two slits for stress relaxation. The purpose of forming the separate slits (the first slit 20a and the second slit 20b) in the plane of the second thick section main body 16a and in the plane of the inclined section 16b is already explained above. Therefore, the explanation is omitted here.

The first slit 20a and the second slit 20b may be arranged in a step shape to separate from each other in the Z' axis direction as shown in FIG. 5D or FIG. 5E rather than being arranged side by side in the X axis direction as shown in the plan view of FIG. 5A. When the two slits 20a and 20b are provided, it is possible to prevent stress caused by the conductive adhesive from being spread to the vibration region 12.

Figure 6:
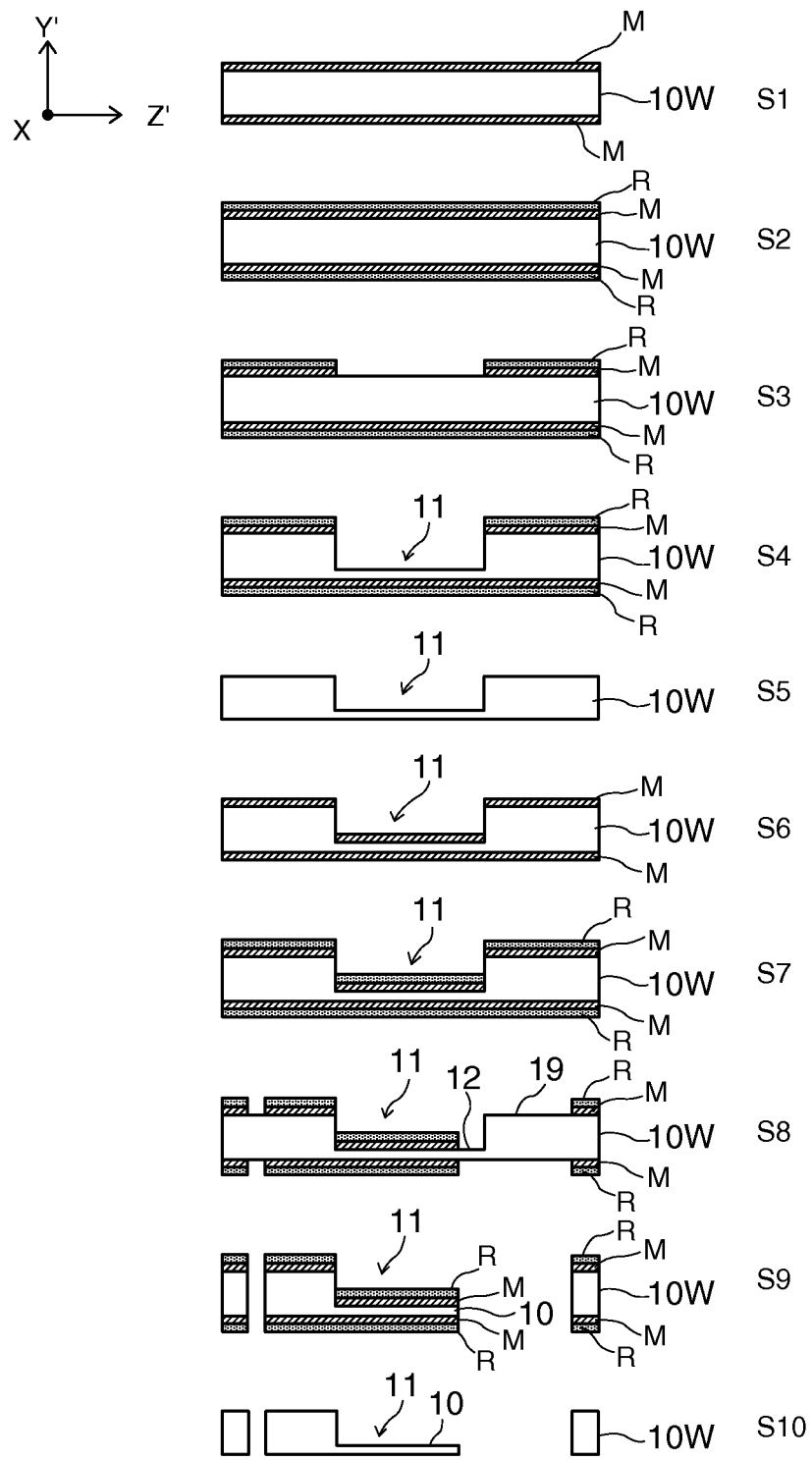
FIG. 6 is an explanatory diagram showing a manufacturing process for a piezoelectric substrate.
Figure 7:
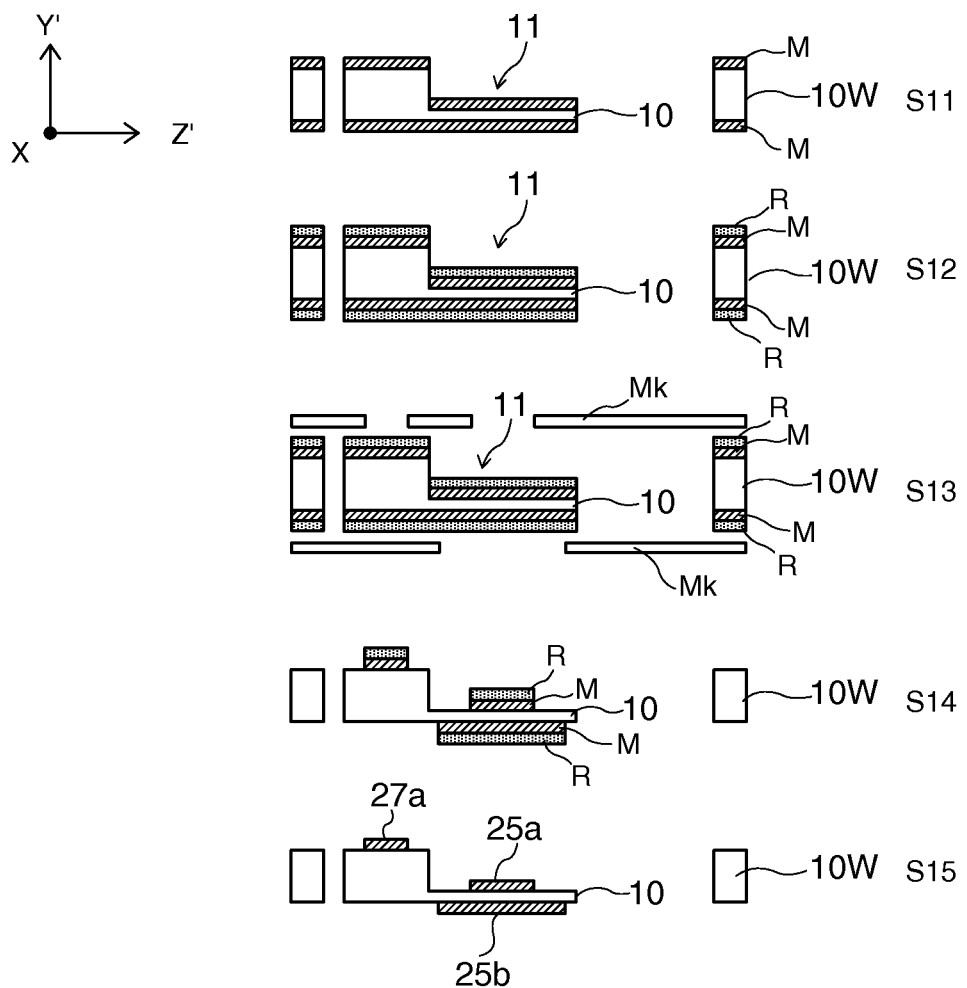
FIG. 7 is an explanatory diagram showing a manufacturing process for excitation electrodes and lead electrodes of the piezoelectric vibration element.

FIGS. 6 and 7 are sectional views of a process flow for explaining a manufacturing process for the formation of the recessed section 11 of the piezoelectric substrate 10, the external shape of the piezoelectric substrate 10, and the slit 20. A quartz crystal wafer is explained as an example of a piezoelectric wafer. In step S1, a quartz crystal wafer 10W having predetermined thickness, for example, 80 μm, both the surfaces of which are polished, is sufficiently cleaned and dried. Thereafter, metal films (anticorrosion films) M in which chrome (Cr) is formed as a base and gold (Au) is laminated on the base are respectively formed on the front and rear surfaces of the quartz crystal wafer 10W by sputtering or the like.

In step S2, photoresist films (hereinafter referred to as "resist films") R are respectively applied over the entire surfaces of the metal films M on the front and the back. In step S3, the resist film R in a position equivalent to the recessed section 11 is exposed to light using a mask pattern and an exposure apparatus. When the resist film R exposed to light is developed and peeled, the metal film M in the position equivalent to the recessed section 11 is exposed. When the metal film M exposed from the resist film R is melted and removed using a solution such as aqua regia, a quartz crystal surface in the position equivalent to the recessed section 11 is exposed.

In step S4, the exposed quartz crystal surface is etched to desired thickness using mixed liquid of hydrofluoric acid and ammonium fluoride. In step S5, the resist film R is peeled using a predetermined solution and the exposed metal film M is removed using aqua regia or the like. At this stage, the quartz crystal wafer 10W is in a state in which recessed sections 11 are regularly arranged in a lattice shape on one surface. Steps S1 to S5 are equivalent to a step of providing the recessed section 11 including the vibration region 12.

In step S6, the metal films (Cr+Au) M are formed on both the surfaces of the quartz crystal wafer 10W obtained in step S5. In step S7, the resist films R are applied to both the surfaces of the metal films (Cr+Au) M formed in step S6.

In step S8, the resist films R in the positions equivalent to the external shape of the piezoelectric substrate 10 and the slit 20 are exposed to light from both the surfaces, using a predetermined mask pattern and the exposure apparatus, developed, and peeled. Further, the exposed metal film M is melted by a solution such as aqua regia and removed.

In step S9, the exposed quartz crystal surface is etched using mixed liquid of hydrofluoric acid and ammonium fluoride to form the external shape of the piezoelectric substrate 10 and the slit 20. When the slit 20 is formed from both the front and rear surface sides of the quartz crystal wafer 10W in a shape having bottoms respectively on the front and rear surfaces (see FIG. 1D), the slit 20 can be formed by using, for example, a change in etching speed caused by reducing the width of the resist films R in the positions corresponding to the slit 20. In step S10, the remaining resist films R are peeled and the exposed excess metal films M are melted and removed. At this stage, the quartz crystal wafer 10W is in a state in which piezoelectric substrates 10 are connected by a supporting thin piece and arranged in a lattice shape.

Steps S6 to S10 are equivalent to a step of forming an external shape that includes the vibration region 12, which has a thick section in which a part of the recessed section 11 is opened, and the slit 20.

A characteristic of this embodiment is that, as shown in steps S8 and S9, a part of the vibration region 12 of the recessed section 11 and a fourth thick section 19 connected to the vibration region 12 are removed by etching. Consequently, a reduction in the size of a piezoelectric substrate is realized. Details are explained below.

After step S10 ends, the thickness of vibration regions 12 of the piezoelectric substrates 10 regularly arranged in the lattice shape on the quartz crystal wafer 10W is measured, for example, optically. When the measured thickness of the vibration regions 12 is larger than predetermined thickness, fine adjustment for the thickness is performed for each of the vibration regions 12 to set the thickness within a range of the predetermined thickness.

A procedure for forming the excitation electrodes 25a and 25b and the lead electrodes 27a and 27b on the piezoelectric substrates 10 after adjusting the thickness of the vibration regions 12 of the piezoelectric substrates 10 formed on the quartz crystal wafer 10W to be within the range of the predetermined thickness is explained with reference to FIG. 7.

In step S11, nickel (Ni) films are formed over the entire front and rear surfaces of the quartz crystal wafer 10W and gold (Au) films are laminated on the nickel films to form the metal films M. In step S12, resist is applied on the metal films M to form the resist films R.

In step S13, the resist films R in positions equivalent to the excitation electrodes 25a and 25b and the lead electrodes 27a and 27b are exposed to light using a mask pattern Mk. In step S14, the resist films R exposed to light are developed and the unnecessary resist films R are peeled using a solution. Subsequently, the metal films M exposed by the peeling of the resist films R are melted by a solution such as aqua regia and removed.

In step S15, when the unnecessary resist films R remaining on the metal films M are peeled, the excitation electors 25a and 25b, the lead electrodes 27a and 27b, and the like are formed on the piezoelectric substrates 10. The divided piezoelectric vibration element 1 is obtained by breaking and removing the half-etched supporting thin piece connected to the quartz crystal wafer 10W.

Steps S11 to S15 are equivalent to a step of forming electrodes in predetermined regions including the front and rear surfaces of the vibration region 12.

Quartz crystal has etching anisotropy peculiar to the quartz crystal in that, when the quartz crystal is wet-etched, the etching proceeds along the Z axis but the speed of etching changes according to the directions of crystal axes. Therefore, in an etching surface emerging according to the etching anisotropy, a difference appears according to the directions of the crystal axes as discussed in a large number of scholarly papers and patent documents in which the etching anisotropy is studied. However, despite such a background, concerning the etching anisotropy of the quartz crystal, there is not clearly systemized material. Since the aspect of the nanofabrication technique is emphasized, under the current situation, there is often a difference in an emerging crystal surface depending on a document presumably because of a difference in conditions of etching (a type of an etching solution, an etching rate, etching temperature, etc.).

Therefore, in manufacturing the piezoelectric vibration element according to the invention using a photolithography technique and a wet etching technique, the inventor of this application repeated an etching simulation, prototype testing, and a surface analysis and an observation at a nano level to find that the piezoelectric resonator takes a form explained below. Therefore, details are explained below.

FIGS. 8A to 8E and FIGS. 9A to 9E are diagrams for explaining a sectional shape of the recessed section 11 on the AT cut quartz crystal wafer 10W formed by etching.

Figure 8A:
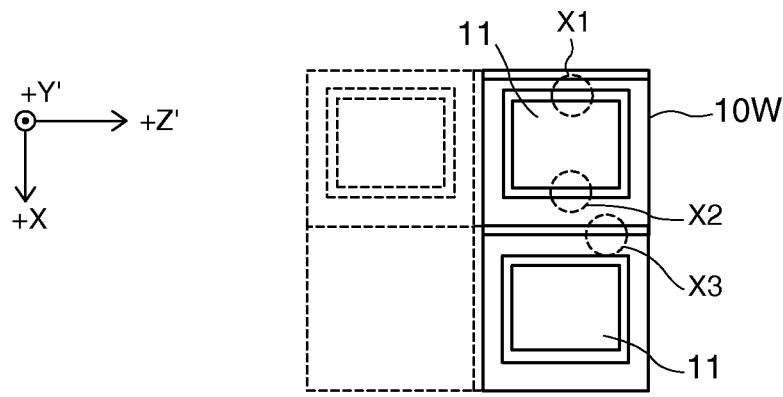
FIG. 8A is a plan view of a recessed section formed in a piezoelectric wafer and FIGS. 8B to 8E are sectional views in a X axis direction of the recessed section.
Figure 8B:
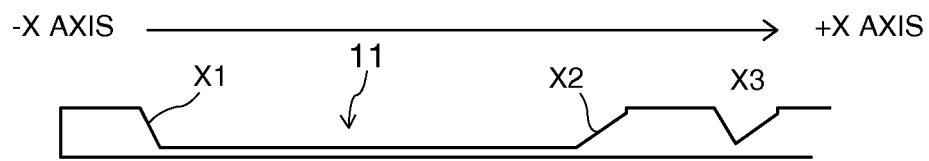
Figure 8C:
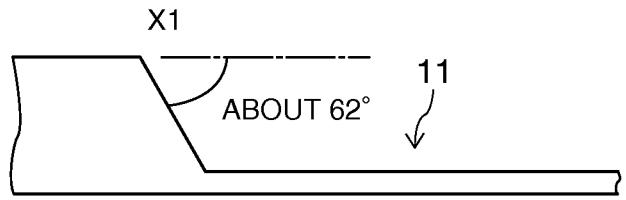
Figure 8D:
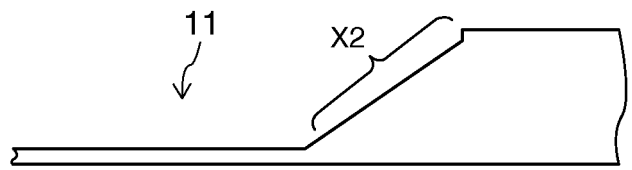
Figure 8E:
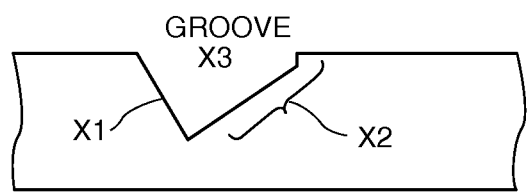

FIG. 8A is a plan view of the quartz crystal wafer 10W in step S5 in FIG. 6. At this stage, the recessed sections 11 are regularly formed in a lattice shape on one surface of the quartz crystal wafer 10W. FIG. 8B is a sectional view in the X axis direction. Wall surfaces of the recessed section 11 form inclined planes rather than vertical wall surfaces. The wall surface in the −X axis direction forms an inclined plane X1 and the wall surface in the +X axis direction forms an inclined plane X2. When a groove orthogonal to the X axis is formed, a wall surface X3 of the cross section of the groove assumes a wedge shape. FIGS. 8C to 8E are enlarged views of the wall surfaces X1 and X2 of the recessed section 11 and the wall surface X3 of the groove. As shown in FIG. 8C, the wall surface in the −X axis direction is etched at inclination of about 62 degrees with respect to the plane of the quartz crystal wafer 10W. As shown in FIG. 8D, the wall surface in the +X axis direction is slightly etched orthogonally (at 90 degrees) with respect to the plane of the quartz crystal wafer 10W. Thereafter, the etching progresses at gentle inclination. The bottom surface of the recessed section 11 along the X axis direction is etched in parallel to the original plane of the quartz crystal wafer 10W. In other words, the vibration region 12 is formed in a flat shape, the front and rear surfaces of which are parallel.

FIG. 8E is a sectional view of a groove for breaking and removal formed in the quartz crystal wafer 10W. The cross section of the groove formed orthogonally to the X axis assumes a wedge shape. This is because the wall surface X3 of the groove is formed by the wall surface X1 in the −X axis direction and the wall surface X2 in the +X axis direction.

When an electrode is provided on the surface on which the recessed section 11 is formed, it is necessary to pay attention to the wall surface perpendicular to the wall surface X2 formed in the +X axis direction. Since rupture of an electrode film tends to occur, it is desirable to avoid the provision of the electrode.

Figure 9A:
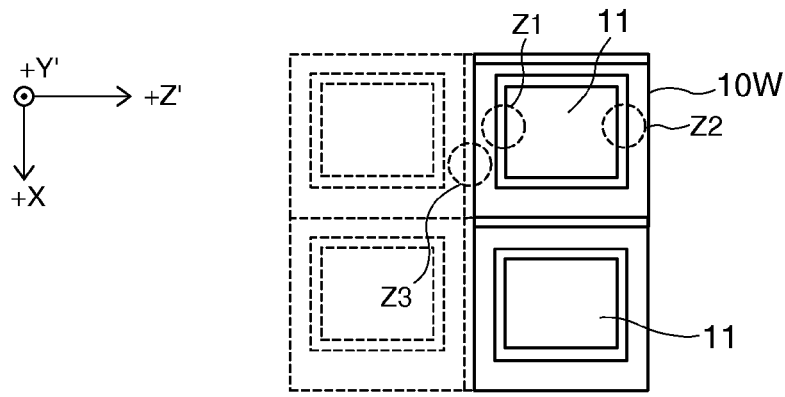
FIG. 9A is a plan view of a recessed section formed in a piezoelectric wafer and FIGS. 9B to 9E are sectional views in a Z' axis direction of the recessed section.
Figure 9B:
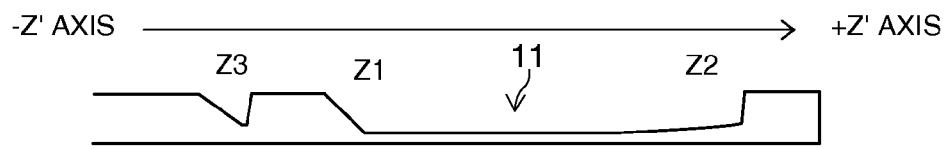

FIGS. 9A to 9E are diagrams for explaining, in particular, the wall surface of the cross section in the Z' axis direction of the recessed section 11 formed on the piezoelectric substrate 10. FIG. 9A is a plan view of the quartz crystal wafer 10W. FIG. 9B is a sectional view in the Z' axis direction of the quartz crystal wafer 10W. The wall surface in the −Z' axis direction forms an inclined plane Z1 and the wall surface in the +Z' axis direction forms an inclined plane Z2. When a groove orthogonal to the Z' axis is formed, a wall surface Z3 of the cross section of the groove assumes a wedge shape.

Figure 9C:
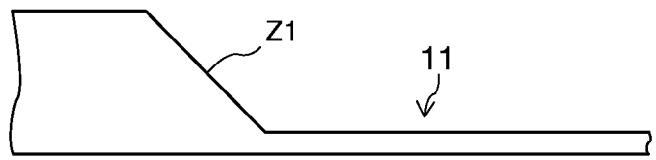
Figure 9D:
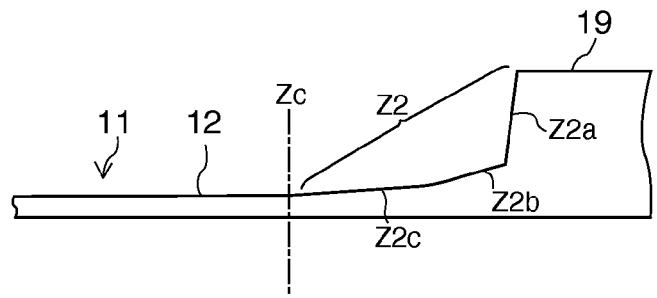
Figure 9E:
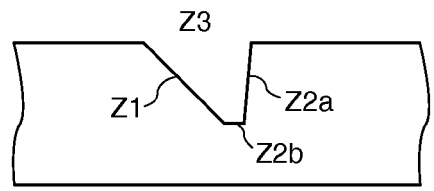

FIGS. 9C to 9E are enlarged views of the wall surfaces Z1 and Z2 of the recessed section 11 and the wall surface Z3 of the groove. As shown in FIG. 9C, the wall surface in the −Z' axis direction is etched at relatively gentle inclination with respect to the plane of the quartz crystal wafer 10W. As shown in FIG. 9D, the wall surface Z2 in the +Z' axis direction is etched on a steep inclined plane Z2a with respect to the plane of the quartz crystal wafer 10W. Thereafter, the etching progresses on a gentle inclined plane Z2b and, thereafter, the wall surface Z2 is formed as a gentler inclined plane Z2c. FIG. 9E is a sectional view of a groove formed orthogonally to the Z' axis direction. The groove is a groove for breaking and removal of the quartz crystal wafer 10W. The groove forms a cross section of a generally wedge shape because the wall surface Z3 of the groove is formed by the wall surface Z1 in the Z' axis direction and the wall surface Z2a and the wall surface Z2b of the wall surface Z2 in the +Z' axis direction. When grooves for breaking and removal are formed in the X axis direction and the Z' axis direction, a sectional shape of the grooves is a wedge shape and the quartz crystal wafer 10W is easily broken and removed.

One characteristic of the invention is that, as shown in FIG. 9D, the gentle inclined plane Z2c not parallel to the original plane on the right side in the figure indicated by an alternate long and short dash line Zc in the vibration region 12 is removed by etching together with the fourth thick section 19, whereby a reduction in the size of the piezoelectric substrate is realized.

Further, a manufacturing method is established on condition that the gentle inclined plane Z2c is removed together with the fourth thick section 19. Therefore, an area of an even extremely thin section to be formed as the vibration region 12 is secured large compared with the structure including the thick sections present at both the ends of the vibration region 12 along the X axis in the past described as the related art. Therefore, it is possible to design the piezoelectric vibration element 1 sufficiently taking into account that a vibration displacement distribution is an elliptical shape having the major axis in the X axis direction because of the anisotropy of an elastic coefficient in the thick shear vibration mode excited by the vibration region 12. Therefore, although a ratio of the major axis and the minor axis is desirably 1.26:1, it is possible to sufficiently design the piezoelectric vibration element 1 such that the ratio is in a range of about 1.14 to 1.39:1 taking into account, for example, fluctuation in manufacturing dimensions.

Figure 15A:
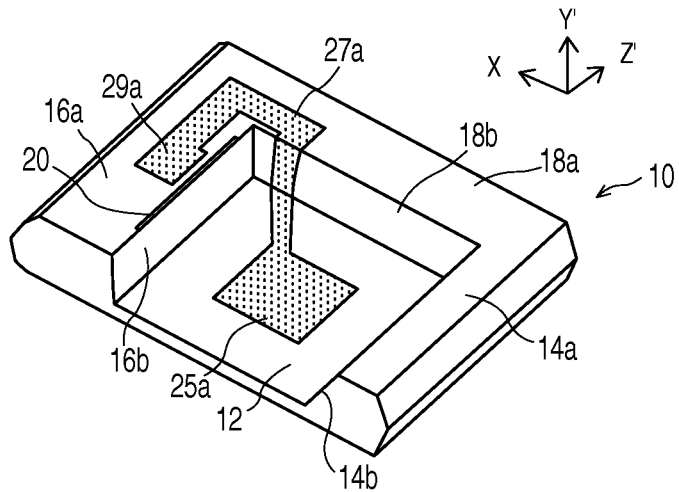
Figure 15B:
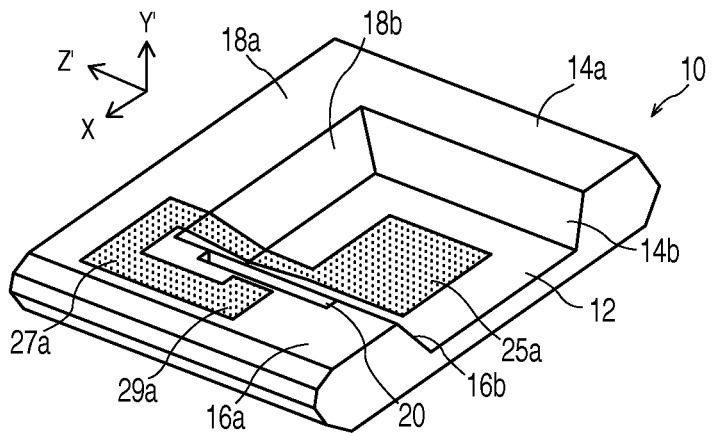
Figure 15C:
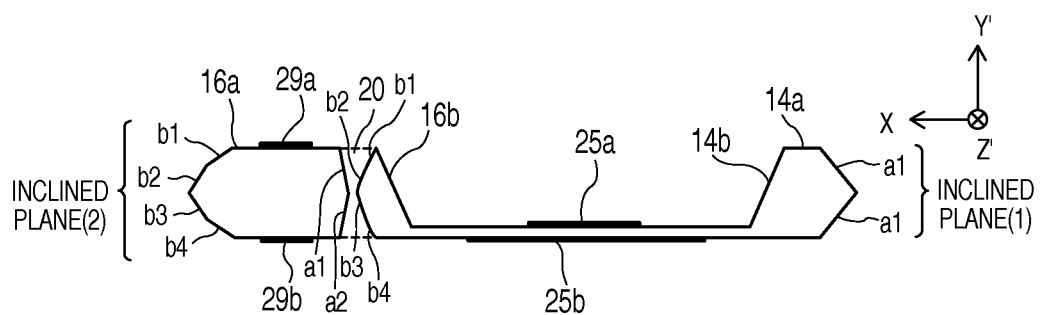

Further, it was found that, as shown in FIGS. 15A to 15C, in the external shape of the piezoelectric vibration element 1, inclined planes also emerge on an end face crossing the X axis, an inclined plane (1) emerges on an end face on a (−) side of the X axis, and an inclined plane (2) emerges on an end face on a (+) side of the X axis. It is also found that the shapes of the cross sections of the inclined plane (1) and the inclined plane (2) parallel to the XY' plane are different. FIGS. 15A to 15C show a modification of the piezoelectric vibration element. FIGS. 15A and 15B are perspective views and FIG. 15C is a longitudinal sectional view.

On both the inclined planes (1) and (2), the vertical wall surface of the wall surface X2 formed in the +X direction shown in FIGS. 8B and 8E does not emerge near places where the inclined planes (1) and (2) cross the main surface of the piezoelectric substrate 10. As a formation time of the inclined plane (1) and the inclined plane (2), an etching time is sufficiently long compared with an etching time necessary for forming the recessed section 11 because etching of the piezoelectric substrate (the quartz crystal substrate) 10 is started from the front and the back and performed until the piezoelectric substrate 10 is pierced through from the front to the back. Therefore, the vertical wall surface does not emerge because of the action of overetching.

It was found that inclined planes a1 and a2 that form the inclined plane (1) are in a substantially symmetrical relation with respect to the X axis.

It was found that, in inclined planes b1, b2, b3, and b4 that form the inclined plane (2), b1 and b4 and b2 and b3 are respectively substantially symmetrical relations with respect to the X axis.

Further, it was found that an inclination angle $\alpha$ of the inclined planes a1 and a2 with respect to the X axis is in a relation of $\beta<\alpha$ with an inclination angle $\beta$ with respect to the X axis of the inclined planes b1 and b4.

Fourth Embodiment

Figure 10A:
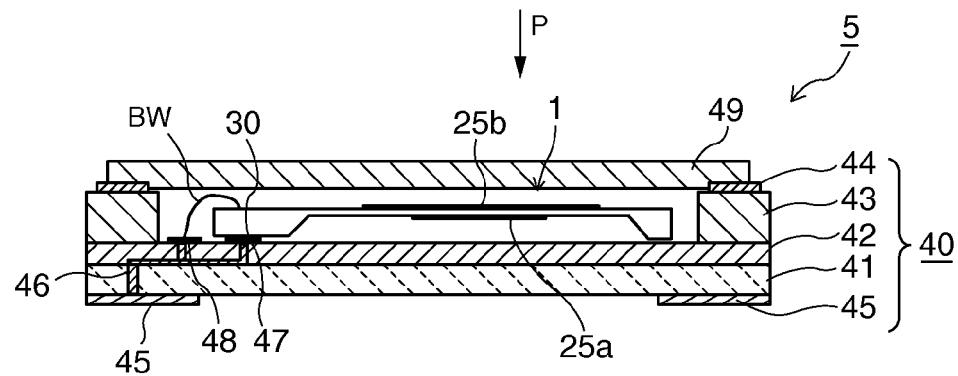
Figure 10B:
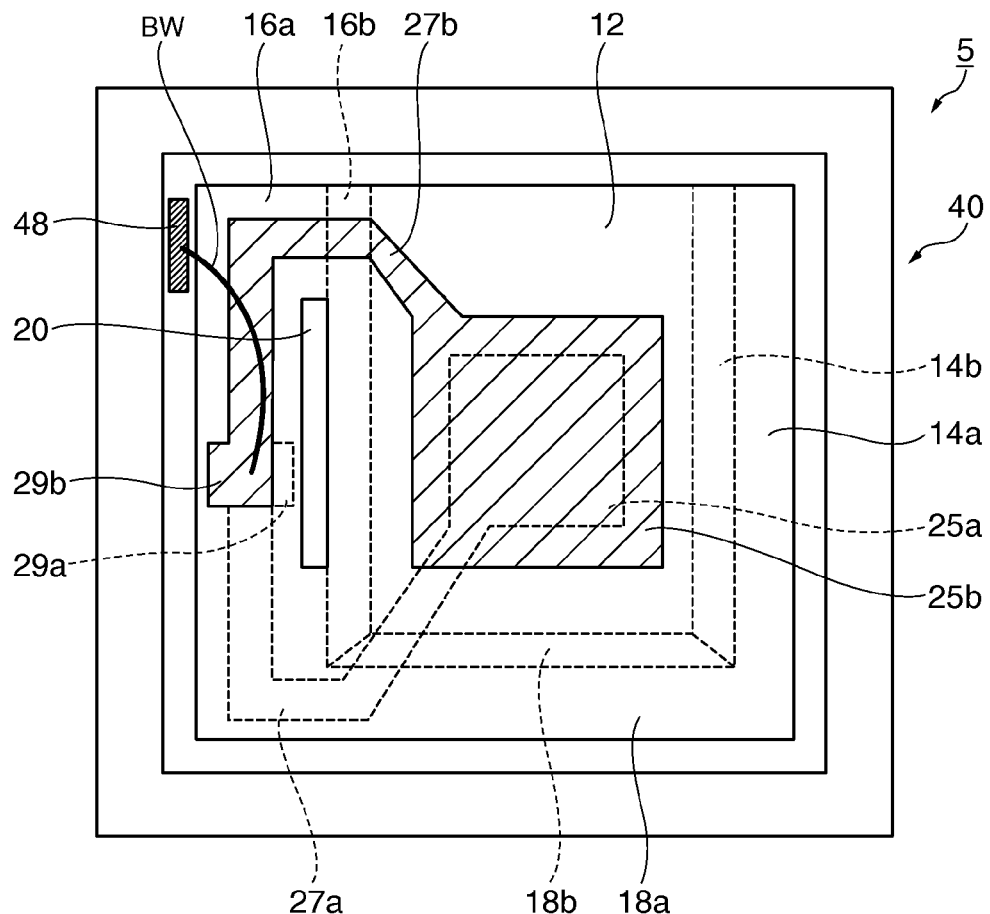

FIGS. 10A and 10B show the configuration of a piezoelectric resonator according to a fourth embodiment. FIG.

10A is a sectional view and FIG. 10B is a plan view viewed from a P direction in FIG. 10A.

A piezoelectric resonator 5 includes, for example, the piezoelectric vibration element 1 and a package that houses the piezoelectric vibration element 1. The package includes a package main body 40 formed in a rectangular box shape and a lid member 49 formed of metal, ceramic, glass, or the like.

As shown in FIGS. 10A and 10B, the package main body is formed by laminating a first substrate 41, a second substrate 42, and a third substrate 43. After an aluminum oxide ceramic green sheet is molded in a box shape as an insulating material, the insulating material is sintered and formed. Plural mounting terminals 45 are formed on the external bottom surface of the first substrate 41. The third substrate 43 is an annular body, the center of which is removed. A metal seal ring 44 of, for example, Kovar is formed at the upper peripheral edge of the third substrate 43.

A concave section in which the piezoelectric vibration element 1 is housed is formed by the third substrate 43 and the second substrate 42. Plural element mounting pads 47 electrically conducted to the mounting terminals 45 by a conductor 46 are provided in predetermined positions on the upper surface of the second substrate 42.

The positions of the element mounting pads 47 are arranged to correspond to the pad electrode 29a, which is formed in the second thick section main body 16a, when the piezoelectric vibration element 1 is placed.

As the configuration of the piezoelectric resonator 5, an appropriate amount of a conductive adhesive 30, for example, a polyimide adhesive with little degassing is applied to the element mounting pads 47 of the package main body 40, the pad electrode 29a of the piezoelectric vibration element 1 and terminal electrodes (the pads 47) of the package are placed on the conductive adhesive 30 to be supported at one point, and a load is applied to the pad electrodes 29a and the terminal electrodes to mechanically fix and electrically connect the pad electrode 29a and the terminal electrodes to the element mounting pads 47. As a characteristic of the conductive adhesive 30, the magnitude of stress ($\propto$ distortion) due to the conductive adhesive 30 is larger in the order of a silicone adhesive, an epoxy adhesive, and a polyimide adhesive. The degassing is larger in the order of the polyimide adhesive, the epoxy adhesive, and the silicone adhesive.

It is advisable to electrically connect the pad electrode 29b and terminal electrodes 48 of the package using a bonding wire BW. When the region where the piezoelectric vibration element 1 is supported is one point in this way, it is possible to reduce stress caused by the conductive adhesive.

It is necessary to put the package main body 40 in a high temperature furnace of predetermined temperature for a predetermined time in order to harden the conductive adhesive 30 of the piezoelectric vibration element 1 mounted on the package main body 40. After applying annealing to the conductive adhesive 30, mass is added to or subtracted from the excitation electrodes 25a and 25b to perform frequency adjustment. The lid member 49 is seam-welded onto the seal ring 44 formed on the upper surface of the package main body 40 to seal the package main body 40. Alternatively, there is also a method of placing the lid member 49 on low-melting point glass applied to the upper surface of the package main body 40 and fusing and closely attaching the lid member 49. The inside of a cavity of the package is evacuated or an inert gas such as nitrogen $N_2$ is filled in the cavity to complete the piezoelectric resonator 5.

In the piezoelectric resonator 5 according to the embodiment explained above, an example in which the laminated plate is used as the package main body 40 is explained. However, a piezoelectric resonator may be configured using a single layer ceramic plate as the package main body 40 and using a cap applied with a drawing treatment as a lid body.

Fifth Embodiment

Figure 11A:
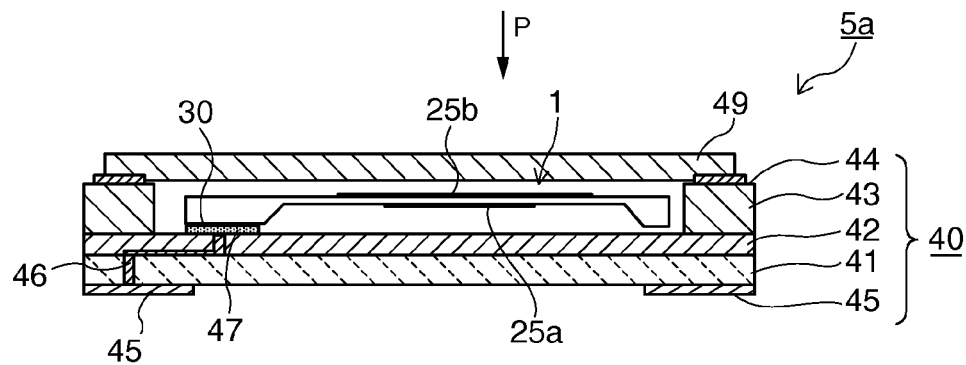
Figure 11B:
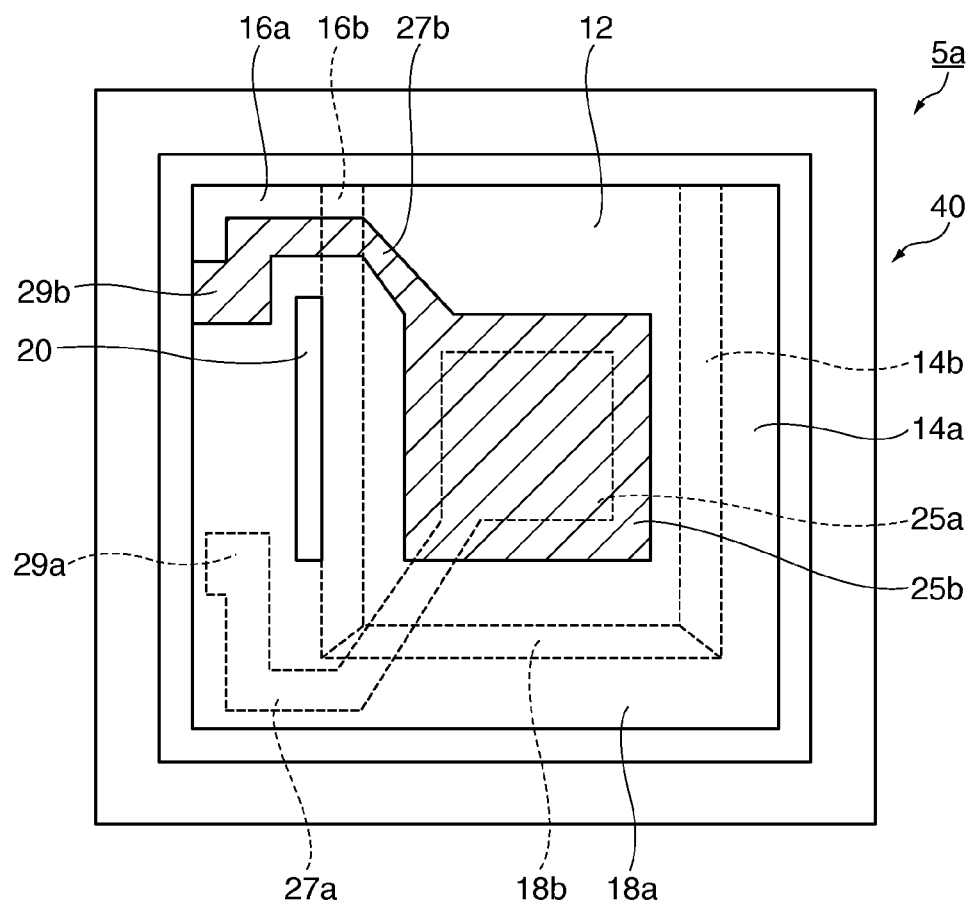

A piezoelectric resonator according to a fifth embodiment is explained with reference to FIGS. 11A and 11B. FIGS. 11A and 11B show the configuration of the piezoelectric resonator. FIG. 11A is a sectional view and FIG. 11B is a plan view viewed from a P direction in FIG. 11A. A piezoelectric resonator 5a is configured by deforming a part of the piezoelectric resonator 5. Therefore, differences from the piezoelectric resonator 5 are explained. Components same as those of the piezoelectric resonator 5 are denoted by the same reference numerals and signs and explanation of the components is omitted.

The excitation electrodes 25a and 25b are formed on the front and rear surfaces of the piezoelectric vibration element 1 used in the piezoelectric resonator 5a. The excitation electrodes 25a and 25b are formed to be opposed to both the front and rear surfaces substantially in the center of the vibration region 12. The excitation electrode 25a is conducted and connected to the pad electrode 29a, which is formed on the front surface of the second thick section main body 16a, by the lead electrode 27a. The excitation electrode 25b is conducted and connected to the pad electrode 29b, which is formed on the rear surface of the second thick section main body 16a, by the lead electrode 27b. The pad electrode 29a and the pad electrode 29b are arranged (arranged side by side) to separate from each other in plan view.

Although not shown in the figures, the pad electrode 29b extends to the front surface of the second thick section main body 16a through a side surface of the second thick section main body 16a. In the piezoelectric vibration element 1, the pad electrode 29b extending to the front surface of the second thick section main body 16a and the pad electrode 29a are mechanically fixed and electrically connected to the element mounting pads 47 of the package main body 40 by the conductive adhesive 30.

In this configuration, the pad electrode 29a and the pad electrode 29b separate from each other in plan view of the piezoelectric vibration element 1 and are provided on the same surface (the rear surface). Therefore, it is possible to fix the piezoelectric vibration element 1 to the element mounting pads 47 using only the conductive adhesive 30.

Figure 12A:
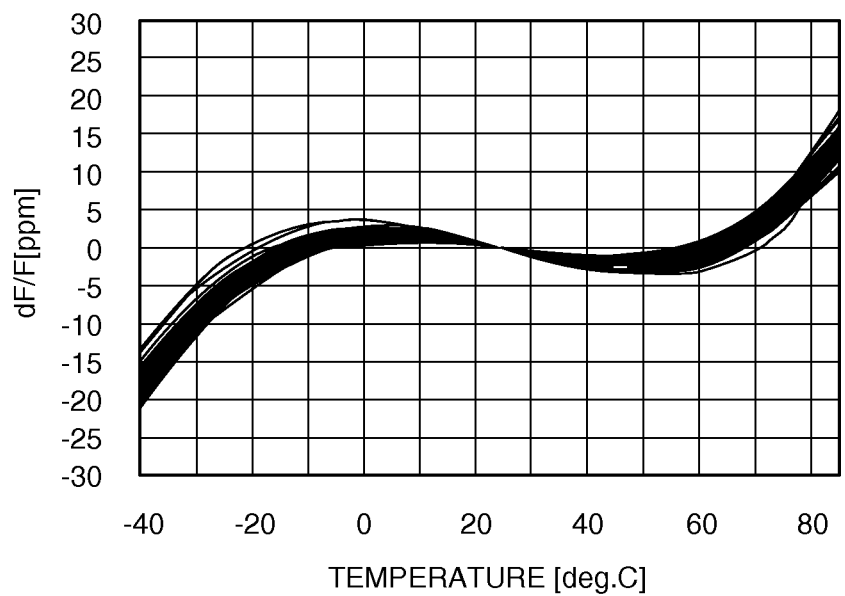
Figure 12B:
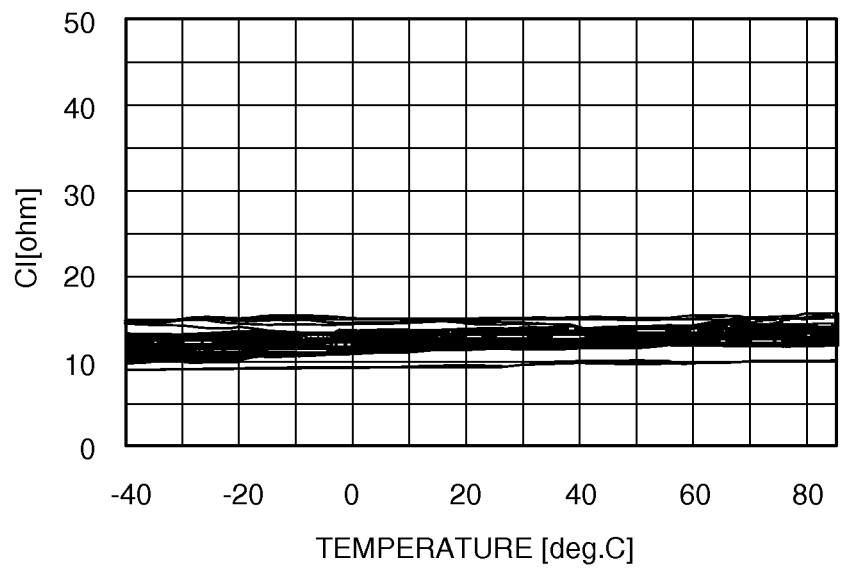

FIGS. 12A and 12B are graphs showing an example of electric characteristics of the piezoelectric resonators 5 and 5a according to the invention. As an example, a resonant frequency is in a 123 MHz band in a fundamental wave mode. This frequency band is developed while being intended to be used in a quartz crystal resonator for a voltage controlled crystal oscillator (VCXO). FIG. 12A is a frequency-temperature characteristic of the piezoelectric resonators 5 and 5a in a temperature range of −40° C. to 85° C. FIG. 12B is a CI (crystal impedance) temperature characteristic of the piezoelectric resonators 5 and 5a in the temperature range. The frequency-temperature characteristic shown in FIG. 12A assumes a smooth cubic curve and satisfies a required standard. The CI temperature characteristic shown in FIG. 12B assumes a satisfactory characteristic without CI dip and the like over the entire temperature range.

Figure 13A:
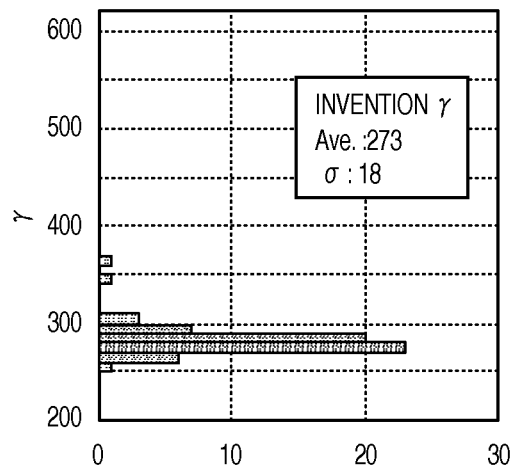
Figure 13B:
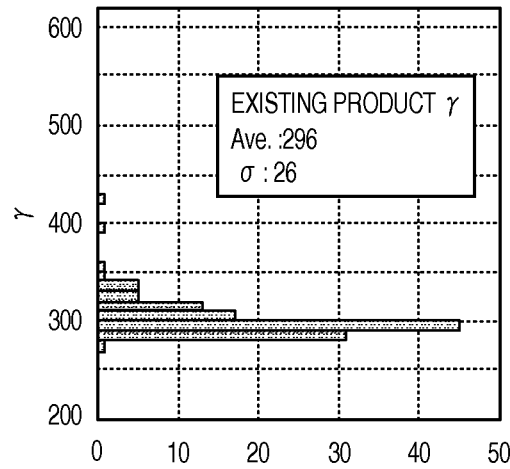

FIG. 13A represents the distribution of a capacity ratio γ of the piezoelectric resonators 5 and 5a according to the invention. As an average of γ, a value 273 was obtained. As a standard deviation σ, a value 18 was obtained. FIG. 13B represents the distribution of the capacity ratio γ of the piezoelectric resonator in the past. An average of γ was 296 and the standard deviation σ was 26.

Figure 13C:
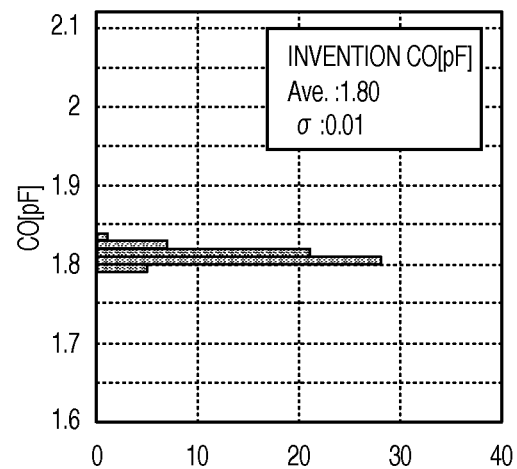
Figure 13D:
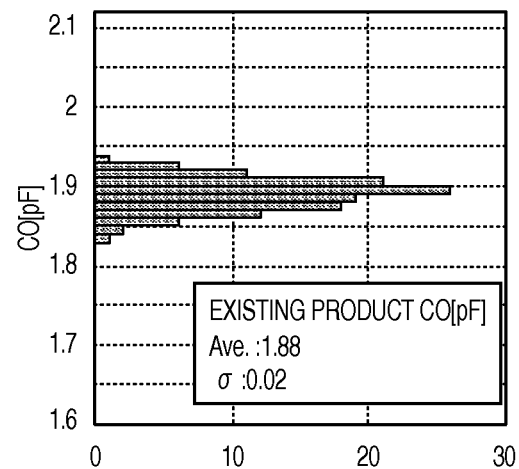

FIG. 13C represents the distribution of capacitance C0 of the piezoelectric resonators 5 and 5a according to the invention. As an average of C0, a value 1.80 (pF) was obtained. As the standard deviation σ, a value 0.01 was obtained. FIG. 13D represents the distribution of the capacitance C0 of the piezoelectric resonator in the past. An average of C0 was 1.88 and the standard deviation σ was 0.02.

FIG. 14A represents the distribution of a spurious CI value ratio (=CIs/CIm, where CIm is a CI value of main vibration and CIs is a CI value of largest spurious vibration near the main vibration) of the piezoelectric resonators 5 and 5a according to the invention. FIG. 14B represents the distribution of a spurious CI value ratio of the piezoelectric resonator in the past.

As it is evident from FIGS. 13A to 13D and FIGS. 14A and 14B, it was found that the piezoelectric resonators 5 and 5a according to the invention are more excellent in all of the capacity ratio γ, the capacitance C0, and the spurious CI value ratio than the piezoelectric resonator in the past. Moreover, a reduction is size is realized in the piezoelectric resonators 5 and 5a according to the invention.

As shown in FIGS. 1A to 1F, the high-frequency fundamental wave piezoelectric vibration element is reduced in size and the spread of stress due to bonding and fixing can be suppressed. Therefore, there is an effect that it is possible to obtain a piezoelectric vibration element excellent in frequency reproducibility, a frequency-temperature characteristic, a CI temperature characteristic, and a frequency aging characteristic and having a small CI value of main vibration and a large ratio of a CI value of near spurious vibrations to the CI value of the main vibration, i.e., a large CI value ratio.

By etching the piezoelectric substrate only from one surface to form the vibration region, it is possible to form a vibration region that keeps a cutting angle of the original substrate. Therefore, there is an effect that it is possible to obtain a high-frequency fundamental wave piezoelectric vibration element excellent in a frequency-temperature characteristic. When the slit 20 is formed in the inclined section 16b as shown in FIGS. 4A and 4B, there is also an effect that it is possible to easily form a slit to pierce through the piezoelectric substrate.

By using the AT cut quartz crystal substrate as the piezoelectric substrate, it is possible to utilize achievements and experiences in many years concerning the photolithography technique and the etching technique. Therefore, there is an effect that mass production of the piezoelectric substrate is possible and, moreover, highly accurate etching can be performed, and the yield of the piezoelectric vibration element is substantially improved.

When the piezoelectric resonator is configured as shown in FIGS. 10A and 10B and FIGS. 11A and 11B, the high-frequency fundamental wave piezoelectric vibration element is reduced in size and stress due to bonding and fixing can be suppressed. Therefore, there is an effect that it is possible to obtain a piezoelectric resonator excellent in frequency reproducibility, a frequency-temperature characteristic, a CI temperature characteristic, and a frequency aging characteristic. Further, there is an effect that it is possible to obtain a piezoelectric vibration element having a small CI value of main vibration and a large ratio of a CI value of near spurious vibrations to the CI value of the main vibration, i.e., a large CI value ratio and it is possible to obtain a piezoelectric resonator having a small capacity ratio γ.

An increase in a frequency was further attempted concerning a resonant frequency. A piezoelectric resonator in the 491 (MHz) band was manufactured by way of trial and evaluated.

A table below shows values obtained by manufacturing three samples of the piezoelectric resonator having 491 (MHz) and measuring equivalent circuit constants concerning the respective samples. It was confirmed that sufficiently satisfactory electric characteristics such as the capacity ratio γ and the capacitance C0 were obtained.

| No | Fs [MHz] | R1 [Ω] | L1 [mH] | C1 [fF] | C0 [pF] | Q | r |
|---|---|---|---|---|---|---|---|
| 1 | 491.010228 | 19.9 | 25.6 | 4.10 | 1.46 | 3,969 | 356 |
| 2 | 491.013806 | 18.4 | 24.4 | 4.30 | 1.47 | 4,095 | 342 |
| 3 | 491.005556 | 17.7 | 25.7 | 4.06 | 1.44 | 4,474 | 355 |

Figure 16:
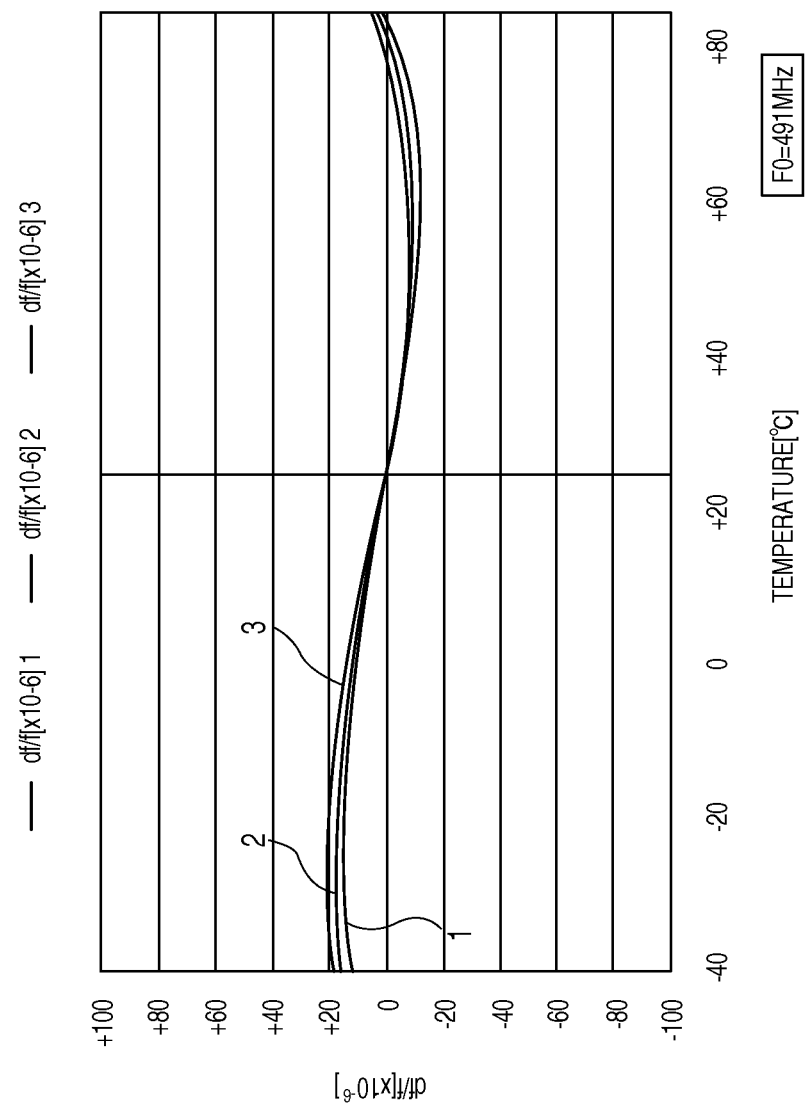
FIG. 16 is an explanatory diagram of characteristics of a piezoelectric resonator functioning as an electronic device.

A VCXO was manufactured using the piezoelectric resonator having 491 (MHz) according to the invention. FIG. 16 is an evaluation result of a frequency-temperature characteristic of the VCXO. The evaluation result assumes a smooth cubic curve and satisfies a required standard. A satisfactory characteristic is obtained without dip and the like over the entire temperature range.

Sixth Embodiment

Figure 17A:
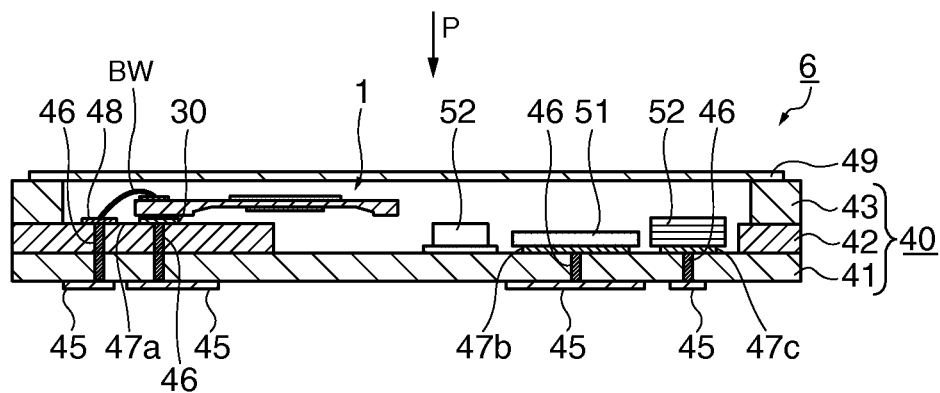
Figure 17B:
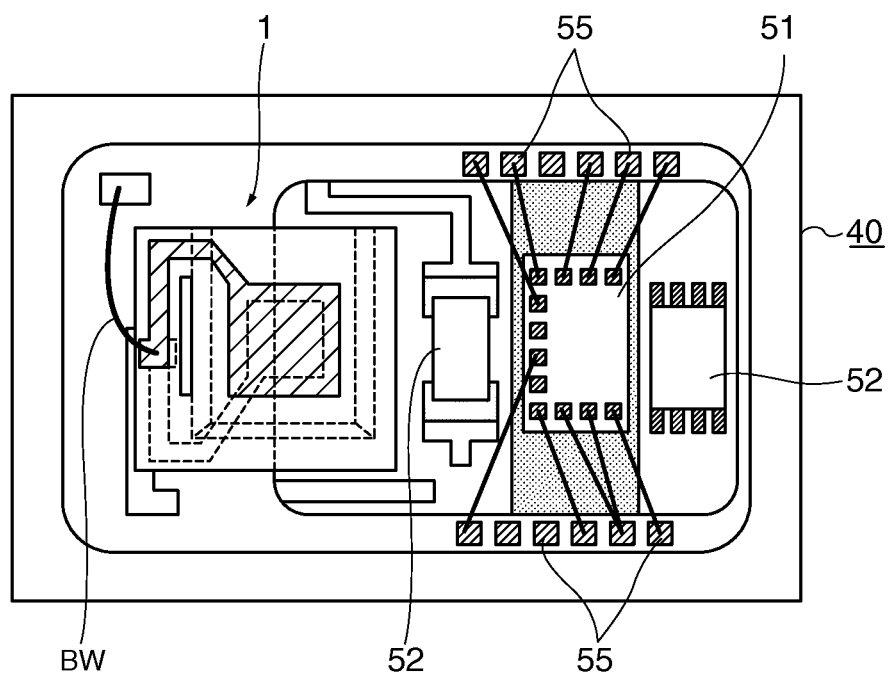

FIGS. 17A and 17B are sectional views showing the configuration of a piezoelectric oscillator, which is a type of an electronic device according to a sixth embodiment. FIG. 17A is a front sectional view and FIG. 17B is a plan view viewed from a P direction in FIG. 17A.

A piezoelectric oscillator 6 includes the package main body 40 including the substrates 41, 42, and 43 in three layers, the lid member 49, the piezoelectric vibration element 1, an IC component 51 mounted with an oscillation circuit that excites the piezoelectric vibration element 1, and an electronic component 52 such as a variable capacity element, the capacity of which changes according to a voltage, or a thermistor or an inductor, the resistance of which changes according to temperature.

The conductive adhesive (polyimide) 30 is applied to the element mounting pads 47 of the package main body 40 and the piezoelectric vibration element 1 is placed on the conductive adhesive 30 to realize conduction with a pad electrode (not shown). The other pad electrode is connected to the other terminal pad of the package main body 40 by the bonding wire BW to realize conduction with one terminal of the IC component 51. The IC component 51 and the electronic component 52 are fixed and connected to predetermined positions on the package main body 40. The mounting terminals 45 are formed on the rear surface (a mounting surface) of the package main body 40. The mounting terminals 45 are conducted and connected, by connection wires 46, to respective terminals provided on the inside of the package main body 40.

The package main body 40 is evacuated or filled with an inert gas such as nitrogen. The package main body 40 is sealed by the lid member 49 to complete the piezoelectric oscillator 6.

Seventh Embodiment

The configuration of a piezoelectric oscillator, which is a type of an electronic device according to a seventh embodiment, is explained with reference to FIGS. 18A and 18B. FIGS. 18A and 18B show the configuration of an electronic device according to the seventh embodiment. FIGS. 18A and 18B are longitudinal sectional views of the piezoelectric oscillator.

In the piezoelectric oscillator 6 according to the sixth embodiment shown in FIGS. 17A and 17B, the piezoelectric vibration element 1, the IC component 51, and the electronic component are arranged on the same piezoelectric substrate. However, in a piezoelectric oscillator 7 according to the seventh embodiment shown in FIG. 18A, an H type package main body 60 is used, the piezoelectric vibration element 1 is housed in the upper part of the package main body 60, and the inside of a cavity is evacuated or filled with nitrogen $N_2$ gas and sealed by the lid member 61. In FIG. 18A, in a housing section in a lower part, the IC component 51 mounted with an oscillation circuit that excites the piezoelectric vibration element 1, an amplification circuit, and the like and the electronic component 52 such as a variable capacity element and, when necessary, an inductor, a thermistor, or a capacitor are conducted and connected to terminals 67 of the package main body 60 via connecting means such as metal bumps (Au bumps) 68. The piezoelectric oscillator 7 according to this embodiment is excellent in frequency aging because the piezoelectric vibration element 1 and the IC component 51 and the electronic component 52 are separated.

Further, as shown in FIG. 18B, the piezoelectric oscillator 6 may include at least one or more electronic components Th in the housing section in the lower part. For example, as the electronic components Th, a thermistor, a capacitor, a reactance element, and the like can be applied. An electronic device using the piezoelectric vibration element as a frequency oscillation source can be constructed.

By configuring an electronic device (e.g., a voltage controlled crystal oscillator) as shown in FIGS. 17A and 17B and FIGS. 18A and 18B, there is an effect that it is possible to obtain a voltage controlled crystal oscillator excellent in frequency reproducibility, a frequency-temperature characteristic, and an aging characteristic and having a small size and a high-frequency (e.g., the 490 MHz band). Since the fundamental wave piezoelectric vibration element 1 is used in the electronic device, there is an effect that it is possible to obtain a voltage controlled crystal oscillator having a small capacity ratio, large frequency variable width, and a satisfactory S/N ratio.

A piezoelectric oscillator, a temperature compensated piezoelectric oscillator, a voltage controlled crystal oscillator, and the like can be configured as the electronic device. There is an effect that it is possible to configure a piezoelectric oscillator excellent in frequency reproducibility and an aging characteristic, a temperature compensated piezoelectric oscillator excellent in a frequency-temperature characteristic, and a voltage controlled crystal oscillator having a stable frequency, a wide variable range, and a satisfactory S/N ratio (a signal to noise ratio).

Figure 19:
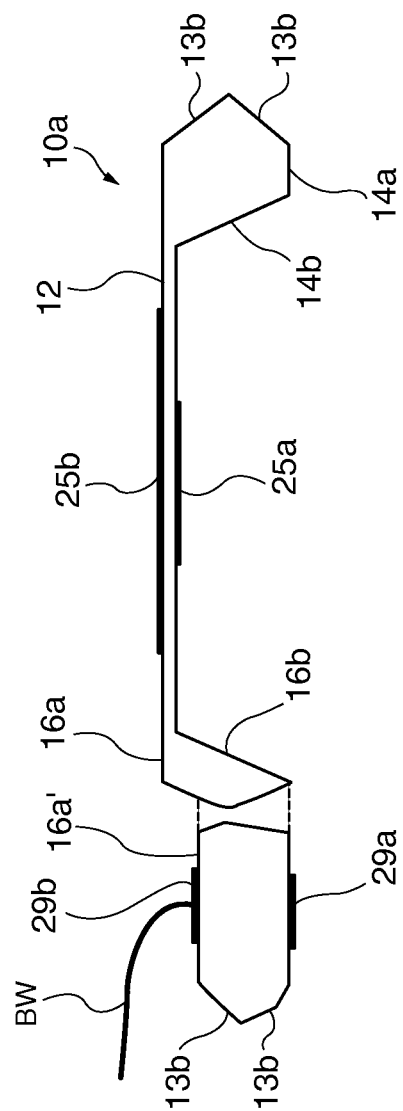
FIG. 19 is a longitudinal sectional view showing a modification of a piezoelectric substrate.

FIG. 19 is a longitudinal sectional view showing a modification of the piezoelectric substrate and is a configuration example in which a step section is formed in a thick section of the piezoelectric substrate and inclined planes are formed on the outer peripheral side surface of the thick section.

In the piezoelectric substrate 10a shown in FIG. 19, as in the configuration explained in the embodiments, the thin vibration region 12 and the first thick section main body 14a and the second thick section main body 16a connected to the vibration region 12 are provided. In the figure, a third thick section main body is not shown. On both the principal planes of the vibration region 12, the excitation electrodes 25a and 25b formed to be opposed to each other on the front and the rear and lead electrodes (not shown) formed to be extended from the excitation electrodes 25a and 25b toward the pad electrodes 29a and 29b respectively provided in the thick sections 14a and 16a' are provided. On the upper surface side in the figure (a side where the excitation electrode 25b is provided) of the second thick section main body 16a, a step section 16a' formed having a step from one principal plane is formed. The pad electrode 29b is formed on the surface of the step section 16a'. The pad electrode 29b is electrically connected to a terminal electrode of a not-shown package by the bonding wire BW. Inclined planes 13b are formed on the outer peripheral side surface of the thick section 16a of the piezoelectric substrate 10a.

By providing the step section 16a' as explained in this example, the height of the pad electrode 29b to which the bonding wire BW is connected is lower than the one principal plane. In the piezoelectric substrate 10a, a surface on which the pad electrode 29a is formed is fixed to a fixed surface of the not-shown package. Therefore, it is possible to reduce the loop height of the bonding wire BW viewed from the fixed surface. There is an effect that the height of an electronic device using the piezoelectric substrate 10a in this example is reduced.

Application Example 1 of the Piezoelectric Substrate

Figure 20A:
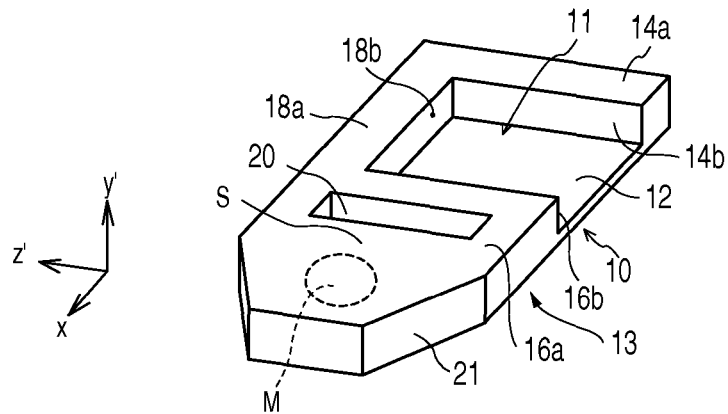

A piezoelectric substrate 10 in an application example shown in FIG. 20A includes a thin section (the recessed section 11) including the vibration region 12 and the thick section 13 provided at the peripheral edge of the thin section and including the first thick section main body 14a, the second thick section main body 16a, and the third thick section main body 18a thicker than the thin section. In the second thick section main body 16a, the mount section M is laterally provided in the direction of an edge side via a buffer section S. The buffer section S includes the slit 20 between the mount section M and the second thick section main body 16a. The mount section M includes chamfered sections 21 at both ends in a direction orthogonal to a direction in which the mount section M, the buffer section S, and the second thick section main body 16a are arranged.

Figure 20B:
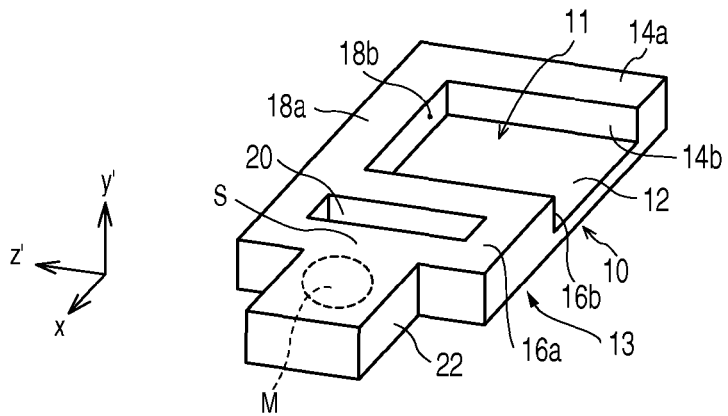

The piezoelectric substrate 10 shown in FIG. 20B includes a thin section (the recessed section 11) including the vibration region 12 and the thick section 13 provided at the peripheral edge of the thin section and including the first thick section main body 14a, the second thick section main body 16a, and the third thick section main body 18a thicker than the thin section.

The mount section M is laterally connected to the second thick section main body 16a via the buffer section S. The buffer section S includes the slit 20 between the mount section M and the second thick section main body 16a. The mount section M includes cutout sections 22 at both ends in a direction orthogonal to a direction in which the mount section M, the buffer section S, and the second thick section main body 16a are arranged.

A longitudinal direction of the slit 20 is parallel to the orthogonal direction. The width in the longitudinal direction of the slit 20 is larger than the width in the orthogonal direction of the mount section M. Both ends in the longitudinal direction of the slit 20 are provided closer to the outer periphery in the orthogonal direction of the buffer section S than both the ends of the mount section M.

Figure 20C:
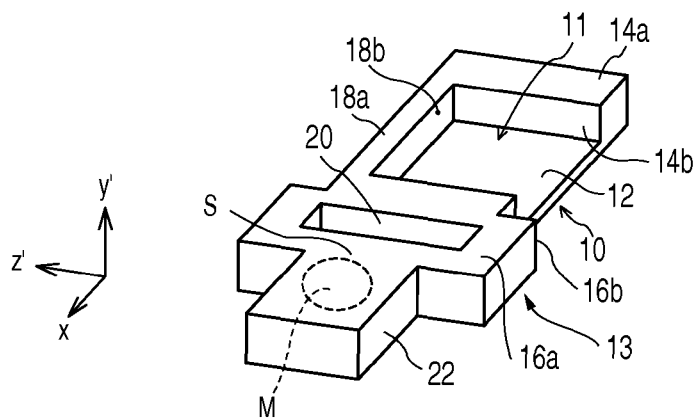

The piezoelectric substrate 10 shown in FIG. 20C includes a thin section (the recessed section 11) including the vibration region 12 and the thick section 13 provided at the peripheral edge of the thin section and including the first thick section main body 14a, the second thick section main body 16a, and the third thick section main body 18a thicker than the thin section.

The buffer section S and the mount section M are coupled to the second thick section main body 16a in order. The buffer section S includes the slit 20 between the mount section M and the second thick section main body 16a. The mount section M includes the cutout sections 22 at both ends in a direction orthogonal to a direction in which the mount section M, the buffer section S, and the second thick section main body 16a are arranged.

Figure 21A:
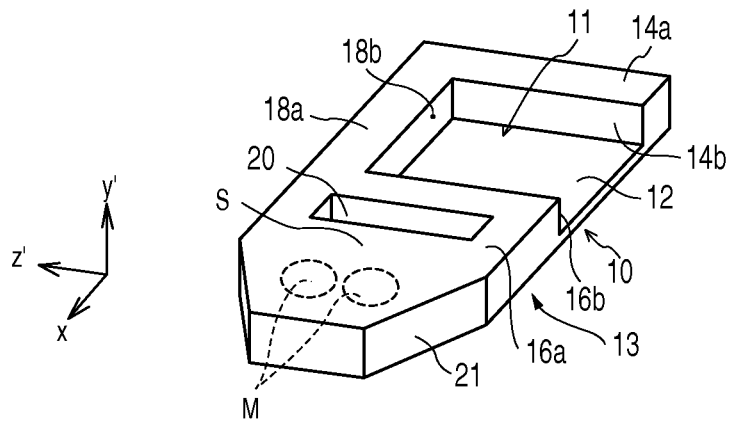
Figure 21B:
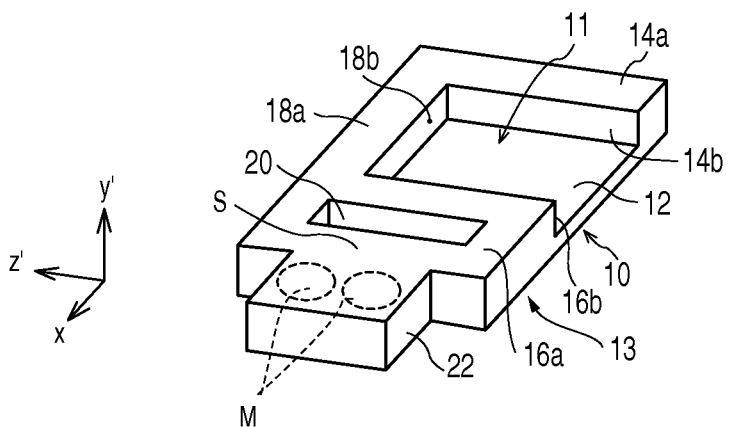
Figure 21C:
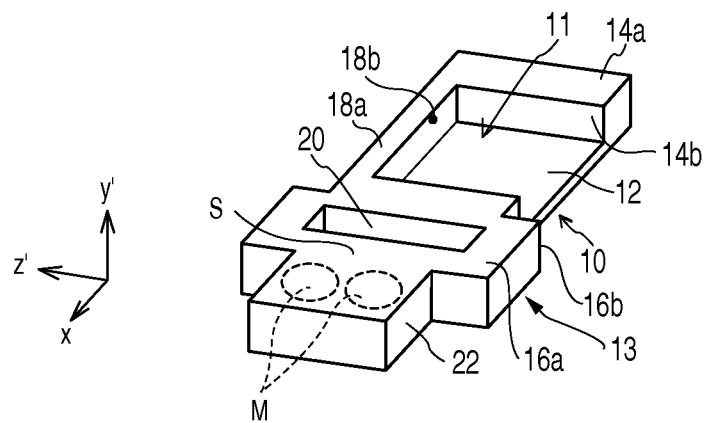

In FIGS. 21A to 21C, as opposed to the structure shown in FIGS. 20A to 20C, a form of supporting at two points is adopted.

In FIGS. 20A to 20C and FIGS. 21A to 21C, inclined sections are not shown on the inner walls of the thick section main bodies 14a, 16a, and 18a of the thick section 13. The inclined planes 13b shown in FIG. 19 are not shown on the sidewall surface on the outer side of the thick section 13. However, the inclined sections and the inclined planes 13b are formed in corresponding regions.

Reference numerals and signs in FIGS. 20A to 20C and FIGS. 21A to 21C correspond to the regions denoted by the same reference numerals and signs in the embodiments.

Application Example 2 of the Piezoelectric Substrate

Figure 22A:
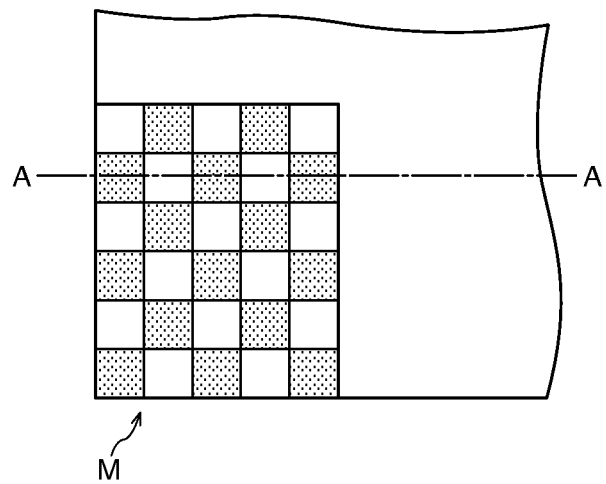
FIGS. 22A and 22B are a main part plan view and a sectional view showing configuration examples of a mount section.
Figure 22B:
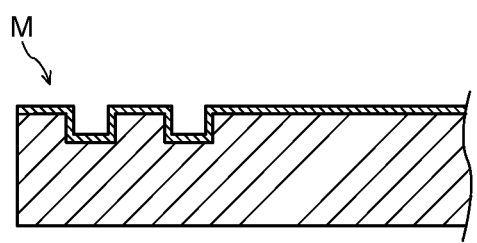

An application example shown in FIGS. 22A and 22B indicate the configuration of a mount section. FIG. 22A is a plan view of the mount section and FIG. 22B is an A-A sectional view of the mount section.

As shown in FIGS. 22A and 22B, the mount section M is formed in an uneven shape in order to improve bonding strength. The surface area of the mount section M is increased by forming the mount section M in the uneven shape in this way and it is possible to improve mount strength.

Electronic Apparatus

Figure 23:
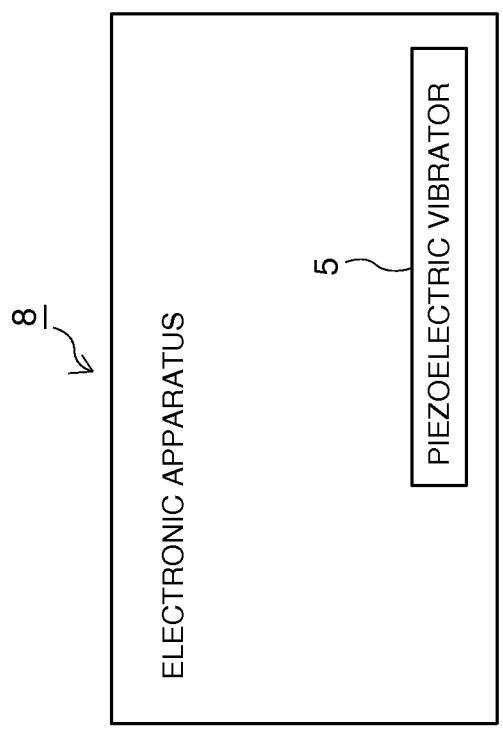
FIG. 23 is a schematic diagram of an electronic apparatus.

FIG. 23 is a schematic diagram showing the configuration of an electronic apparatus according to the invention. An electronic apparatus 8 includes the piezoelectric resonator 5 explained above. Examples of the electronic apparatus 8 using the piezoelectric resonator 5 include a transmission apparatus. In the electronic apparatus 8, the piezoelectric resonator 5 is used as a reference signal source, a voltage controlled crystal oscillator (VCXO), or the like. An electronic apparatus having a small size and satisfactory characteristics can be provided. As explained above, the piezoelectric resonator according to the invention is suitably used as a reference frequency source having a high frequency, excellent in frequency stability, and having a satisfactory S/N ratio. Therefore, by using the piezoelectric resonator according to the invention, there is an effect that it is possible to configure an electronic apparatus that can be used in, for example, a communication base station and desired to have high performance and high reliability.

What is claimed is:

1. A vibration element comprising:
a substrate that includes a first region having a vibration region that vibrates with a thickness shear vibration, the substrate including a second region that is integrated with a peripheral area of the first region, and the second region having a thickness larger than a thickness of the first region, wherein
the peripheral area of the first region includes
a first outer edge and a second outer edge that respectively extend in a first direction perpendicular to a vibration direction of the thickness shear vibration, and the first outer edge is located away from the second outer edge in the vibration direction, and
a third outer edge and a fourth outer edge that respectively extend in the vibration direction, and the third outer edge is located away from the fourth outer edge in the first direction,
the second region includes
a first thick section that includes a first inclined section having a thickness increasing as the first inclined section separates further away from one end edge connected to the first outer edge of the first region toward other end edge and that includes a first thick main body connected to the other end edge of the first inclined section,
a second thick section that includes a second inclined section having a thickness increasing as the second inclined section separates further away from one end edge connected to the second outer edge of the first region toward other end edge and that includes a second thick main body connected to the other end edge of the second inclined section, and
a third thick section that includes a third inclined section having a thickness increasing as the third inclined section separates further away from one end edge connected to the third outer edge of the first region toward other end edge and that includes a third thick main body connected to the other end edge of the third inclined section, and
the second thick section has a mounting member that is attached to another member.

2. The vibration element according to claim 1, wherein
one surface of the first thick section, one surface of the second thick section and one surface of the third thick section respectively project from one surface of the first region, and
the other surface of the first thick section, the other surface of the second thick section and the other surface of the third thick section are even with the other surface of the first region.

3. The vibration element according to claim 2, wherein
when an electrical axis, a mechanical axis and an optical axis that are crystal axis of a quartz crystal are respectively represented as an X axis, a Y axis and a Z axis, and when an axis obtained by inclining the Z axis so that a +Z side is rotated in a −Y direction of the Y axis is represented as a Z' axis and an axis obtained by inclining the Y axis so that a +Y side is rotated in a +Z direction of the Z axis is represented as a Y' axis, using the X axis as a rotation axis, the substrate is a quartz crystal plate in which a surface including the X axis and the Z' axis corresponds to a main surface and a direction of the Y' axis corresponds to a thickness.

4. The vibration element according to claim 3, wherein the third thick section is located in a +Z' direction of the Z' axis.

5. The vibration element according to claim 3, wherein the second thick section is located in a +X direction of the X axis.

6. The vibration element according to claim 3, wherein the one surfaces of the first through third thick sections project from the one surface of the first region in a +Y direction of the Y' axis.

7. The vibration element according to claim 6, wherein the third thick section is located in a +Z' direction of the Z' axis.

8. The vibration element according to claim 6, wherein the second thick section is located in a +X direction of the X axis.

9. An vibrator comprising:
the vibration element according to claim 1; and
a package that houses the vibration element.

10. An vibrator comprising:
the vibration element according to claim 2; and
a package that houses the vibration element.

11. An electronic device comprising:
the vibration element according to claim 1; and
an electronic component.

12. The electronic device according to claim 11, wherein the electronic component is any one of a variable capacity element, a thermistor, an inductor, and a capacitor.

13. An electronic device comprising:
the vibration element according to claim 2; and
an electronic component.

14. The electronic device according to claim 13, wherein the electronic component is any one of a variable capacity element, a thermistor, an inductor, and a capacitor.

15. An electronic device comprising:
the vibration element according to claim 1; and
an electronic circuit.

16. An electronic device comprising:
the vibration element according to claim 2; and
an electronic circuit.

17. An electronic apparatus comprising:
the vibration element according to claim 1.

18. An electronic apparatus comprising:
the vibration element according to claim 2.

* * * * *